United States Patent
Yuan et al.

(10) Patent No.: US 12,098,957 B2
(45) Date of Patent: Sep. 24, 2024

(54) COLORIMETER AND REFLECTIVITY MEASURING METHOD BASED ON MULTICHANNEL SPECTRUM

(71) Applicant: CaiPu Technology (Zhejiang) Co., Ltd., Zhejiang (CN)

(72) Inventors: Kun Yuan, Zhejiang (CN); Yang Zhang, Zhejiang (CN); Jian Wang, Zhejiang (CN)

(73) Assignee: CaiPu Technology (Zhejiang) Co., Ltd., Zhejiang (CN)

( * ) Notice: Subject to any disclaimer, the term of this patent is extended or adjusted under 35 U.S.C. 154(b) by 268 days.

(21) Appl. No.: 17/694,682

(22) Filed: Mar. 15, 2022

(65) Prior Publication Data
US 2022/0196477 A1 Jun. 23, 2022

Related U.S. Application Data

(63) Continuation of application No. PCT/CN2020/104742, filed on Jul. 27, 2020.

(30) Foreign Application Priority Data

Jun. 19, 2020 (CN) .......................... 202010565284.4

(51) Int. Cl.
*G01J 3/52* (2006.01)
*G01J 3/02* (2006.01)
(Continued)

(52) U.S. Cl.
CPC ............. *G01J 3/524* (2013.01); *G01J 3/0229* (2013.01); *G01J 3/0251* (2013.01);
(Continued)

(58) Field of Classification Search
CPC ........ G01J 3/524; G01J 3/0229; G01J 3/0251; G01J 3/0267; G01J 3/0272; G01J 3/0291;
(Continued)

(56) References Cited

U.S. PATENT DOCUMENTS 6,707,555 B1 * 3/2004 Kusuzawa ........... G01N 21/474
356/440
9,243,953 B1 * 1/2016 Yuan ..................... G01J 3/0208
(Continued)

FOREIGN PATENT DOCUMENTS

CN 202974440 6/2013
CN 104501960 4/2015
(Continued)

*Primary Examiner* — Michelle M Iacoletti
*Assistant Examiner* — Noah J. Haney
(74) *Attorney, Agent, or Firm* — JCIPRNET

(57) ABSTRACT

Disclosed are a colorimeter and a reflectivity measuring method based on a multichannel spectrum. The colorimeter includes a main unit and a calibration box, wherein the main unit includes an integrating sphere, a light source and a main sensor, a detection hole is formed in one side of a top of the integrating sphere, a light-through hole is formed in a side of the integrating sphere, and a measuring port is formed in a bottom of the integrating sphere, the light source is arranged outside the light-through hole, and the main sensor is arranged outside the detection hole; the calibration box includes a housing and a white board arranged at a top of the housing, the white board is correspondingly matched with the measuring port, and the calibration box is connected with the main unit; the sensor is a multichannel spectral sensor.

10 Claims, 20 Drawing Sheets

(51) Int. Cl.
*G01J 3/10* (2006.01)
*G01J 3/46* (2006.01)
*G01N 21/47* (2006.01)
*G01R 33/02* (2006.01)
*G01R 33/07* (2006.01)

(52) U.S. Cl.
CPC ........... *G01J 3/0267* (2013.01); *G01J 3/0272* (2013.01); *G01J 3/0291* (2013.01); *G01J 3/10* (2013.01); *G01J 3/46* (2013.01); *G01J 3/465* (2013.01); *G01N 21/4738* (2013.01); *G01N 21/474* (2013.01); *G01J 2003/467* (2013.01); *G01R 33/02* (2013.01); *G01R 33/072* (2013.01)

(58) Field of Classification Search
CPC ...... G01J 3/10; G01J 3/46; G01J 3/465; G01J 2003/467; G01N 21/4738; G01N 21/474; G01N 21/25; G01N 21/251; G01R 33/02; G01R 33/072
See application file for complete search history.

(56) References Cited

U.S. PATENT DOCUMENTS

| | | | | |
|---|---|---|---|---|
| 2008/0266563 | A1* | 10/2008 | Redman | G01J 3/0272 |
| | | | | 356/406 |
| 2011/0128540 | A1* | 6/2011 | Iida | G01J 1/04 |
| | | | | 356/243.1 |
| 2018/0252584 | A1* | 9/2018 | Yamanoi | G01J 3/0275 |
| 2018/0356285 | A1* | 12/2018 | Yamada | G01J 3/0262 |
| 2023/0168123 | A1* | 6/2023 | Boes | G02B 13/08 |
| | | | | 356/326 |

FOREIGN PATENT DOCUMENTS

| | | | | | |
|---|---|---|---|---|---|
| CN | 108195469 | A | * | 6/2018 | ............. G01J 3/46 |
| CN | 109506780 | | | 3/2019 | |
| CN | 209541904 | | | 10/2019 | |
| CN | 209541904 | U | * | 10/2019 | ............. G01J 3/46 |
| CN | 111141387 | A | * | 5/2020 | ............. G01J 3/50 |
| EP | 0037761 | | | 10/1981 | |
| JP | 2002243550 | A | * | 8/2002 | ............. G01J 3/50 |
| WO | 2019220799 | | | 11/2019 | |

* cited by examiner

COLORIMETER AND REFLECTIVITY MEASURING METHOD BASED ON MULTICHANNEL SPECTRUM

CROSS-REFERENCE TO RELATED APPLICATIONS

This application is a continuation of international PCT application serial no. PCT/CN2020/104742, filed on Jul. 27, 2020, which claims the priority benefit of China application no. 202010565284.4, filed on Jun. 19, 2020. The entirety of each of the above-mentioned patent applications is hereby incorporated by reference herein and made a part of this specification.

TECHNICAL FIELD

The present invention relates to the technical field of optical color difference measurement, in particular to a colorimeter and a reflectivity measuring method based on a multichannel spectrum.

BACKGROUND

With the development of optical measurement technology, a color photometer or colorimeter is usually used to measure color difference in the field of color difference measurement, but the traditional color photometer is expensive, the traditional colorimeter cannot output a spectrum, and both are generally large in volume, inconvenient to carry. Traditional instrument calibration boxes require manual alignment and are stored separately from the instruments under normal circumstances, easy to lose.

SUMMARY

In order to solve the deficiencies of the prior art and achieve the purposes of increasing measurement accuracy, lowering cost and improving portability, the present invention adopts the following technical solution:

A colorimeter based on a multichannel spectrum includes a main unit and a calibration box, wherein the main unit includes an integrating sphere, a light source and a main sensor, a detection hole is formed in one side of a top of the integrating sphere, a light-through hole is formed in a side of the integrating sphere, a measuring port is formed in a bottom of the integrating sphere, the main sensor is arranged outside the detection hole and configured to measure a measured sample, and the light source is arranged outside the light-through hole to ensure that all wavelengths within a measurement range have spectral energy; the calibration box includes a housing and a white board arranged at a top of the housing, the white board is correspondingly matched with the measuring port, and the calibration box is connected with the main unit; the sensor is a multichannel spectral sensor; the main unit is composed of an upper cover, a light guide ring, a PCB board and a main body successively from top to bottom, wherein an internal thread arranged inside the upper cover is connected with an external thread arranged outside the light guide ring, threaded fixing holes with an internal thread formed in the light guide ring are connected with the main body through a connecting screw, and an indicating light source is arranged on the PCB board. This structure can make an outer surface of the main unit uniformly shine by 360°, achieving an effect of state indication.

Light directly irradiates to an inner wall of the integrating sphere through the light-through hole, forms 360° uniform luminance of the whole sphere through multiple reflections by a highly reflective material on the inner wall of the integrating sphere, and then irradiates to a sample surface through the measuring port; the main sensor measures the sample surface through the detection hole and the measuring port to obtain measured data.

A light barrier is arranged at a lower end of the light-through hole, configured to prevent light from directly irradiating to the measuring port.

A diaphragm piece is arranged in the detection hole, configured to limit a measurement area of the main sensor, and ensure that only reflected light from the measuring port can enter the main sensor, while light from the inner wall of the integrating sphere cannot enter the main sensor.

A light output hole is formed in one side of the light source, and an auxiliary sensor is arranged at the other side of the light output hole, configured to measure a fluctuation of the light source.

A stepped notch is formed in a top of the housing, a white board is arranged at a bottom of the stepped notch, corresponding magnetic devices are arranged around the white board and at a top and a bottom of the main unit respectively, and the calibration box is jacketed with the main unit through the stepped notch and magnetically fixed through the magnetic devices. When calibration is performed, the calibration box is jacketed at the bottom of the main unit and magnetically fixed, not easy to fall off, avoiding abnormal calibration as a result of situations that the main unit and the calibration box are not corresponding, not fastened or not pressed in manual calibration; when calibration is not performed, the calibration box is placed reversely and attracted at the top of the main unit, and magnetically fixed as well, not easy to fall off, with an integrated structure which is carried and stored more conveniently and avoids loss.

The magnetic device arranged at the bottom of the main unit is an opened hoop, the magnetic devices arranged around the white board are magnets, and a magnetic induction sensor is arranged at an opening of the opened hoop, configured to output a signal to a microprogrammed control unit (MCU) of the main unit for automatic calibration.

Automatic magnetic induction calibration is used for the MCU, including the following steps:

S101, a MCU waits placement of a magnetic induction sensor into the opening;

S102, the MCU senses the placement, and S103 proceeds when a difference between a last calibration time and a current time is larger than an interval threshold, or the process returns to S101;

S103, S104 proceeds when magnets are continuously detected within a continuous threshold, or the process returns to S101;

S104, multiple calibration measurements are performed to judge whether the magnets are moved or pushed aside, and S105 proceeds when the magnets are not moved in the calibration process, or the process returns to S101;

S105, S106 proceeds when a signal fluctuation between the calibration measurements is less than a fluctuation threshold, or the process returns to S101; and S106, an average value of the multiple calibration measurements is compared with a last calibrated signal; the calibration succeeds when the signal fluctuation is less than the fluctuation threshold, and the average value of the multiple calibration measurements and a last calibration measurement time of this round are saved, and the process returns to S101, or the process returns to S101 directly.

Abnormal calibration data caused by users getting close to the magnets or removing the calibration box during magnet induction calibration should be avoided.

A white board, an elastic device and a button are arranged on the housing from top to bottom, wherein legs arranged at a top of the button are correspondingly matched with calibration box holes formed in a top of the housing and a measurement button arranged at a top of the main unit, and a protrusion arranged at an edge of a bottom of the button is matched with a button pressing plate arranged at a bottom of the housing to prevent the button from ejecting out of the housing. When calibration is not performed, the calibration box is placed reversely at the top end of the main unit, the button can replace the measurement button through the legs, and meanwhile the button pressing plate can fix the magnetic devices to prevent the magnetic devices from vertical displacements.

A reflectivity measuring method based on a multichannel spectrum includes the following steps:

S201, standard reflectivity and corresponding multichannel sampling data are arranged in a main unit:

n standard colors are measured by the main unit to obtain i-channel data $S_{n,i}$ of each standard color, n standard colors are measured by a standard machine to obtain $\lambda$ reflectivity data $T_{n,\lambda}$ of each color, and these data are arranged in the main unit;

S202, a measured sample is measured by the main unit to obtain multichannel target color data $C_i$;

S203, the main unit is traversed to find standard color channel data $S_{n,i}$ closest to the target color data, and a difference between the target color and the standard color based on each channel is calculated as follows:

$$d_{n,i} = S_{n,i} - C_i$$

total differences are calculated as follows:

$$D_n = \sqrt{d_{n,1}^2 + d_{n,2}^2 + \ldots + d_{n,8}^2}$$

a position m(m∈n) is obtained according to a minimum value of the total differences $D_n$, and $S_{m,i}$ and $T_{m,\lambda}$ corresponding to the minimum value are recorded;

S204, the i-channel target color data $C_i$ are calculated as $\lambda$-channel data $c_\lambda$, wherein $C_i$ is the $i^{th}$ channel data, and $w_i$ is a wavelength corresponding to the $i^{th}$ channel; $c_\lambda$ is calculated with $C_i$ and $W_i$:

$$k_i = \frac{C_{i+1} - C_i}{W_{i+1} - W_i}$$

$$b_i = C_{i+1} - k_i * W_{i+1}$$

$$c_\lambda = k_i * \lambda + b_i$$

S205, i-channel advancing color $S_{m,i}$ is calculated as $\lambda$-channel data $s_\lambda$:

$$k_i' = \frac{S_{m,i+1} - S_{m,i}}{W_{i+1} - W_i}$$

$$b_i' = S_{m,i+1} - k_i' * W_{i+1}$$

$$s_\lambda = k_i' * \lambda + b_i'$$

S206, the reflectivity is calculated and outputted as follows:

$$R_\lambda = \frac{T_{m,\lambda}}{s_\lambda} * c_\lambda.$$

The present invention features the following advantages and beneficial effects:

Through the reflectivity measurement method, the colorimeter measurement accuracy is increased, and the cost is reduced; the main unit and the calibration box are of an integrated structure, so that the calibration box can be placed at a bottom of the main unit during calibration and placed at a top of the main unit during no calibration; moreover, the calibration box button can be directly pressed for test instead of the test button; the integrated structure is convenient to carry and store, and avoids loss of the calibration box; the magnetic connection manner ensures it is not easy to fall off, and the magnetic induction automatic calibration function of the calibration box is also provided in combination with an automatic magnetic induction calibration method.

In the figure: 1. main unit; 101. upper cover; 102. internal thread; 103. light guide ring; 104. PCB board; 105. main body; 106. connecting screw; 107. LED lamps; 108. external thread; 109. threaded fixing holes; 2. calibration box; 201. white board; 202. stepped notch; 203. housing; 204. spring; 205. button; 206. protrusion; 207. button pressing plate; 208. magnets; 209. legs; 210. calibration box holes; 3. auxiliary sensor; 4. integrating sphere; 401. light-through hole; 402. measuring port; 403. detection hole; 5. light output hole; 6. light source; 7. light barrier; 8. opened hoop; 9. diaphragm piece; 10. main sensor; 11. magnetic induction sensor; 12. measurement button; 13. hoop.

DETAILED DESCRIPTION OF THE EMBODIMENTS

The specific implementation modes of the present invention will be described in detail below in combination with the accompanying drawings. The specific implementation modes described herein are used for describing and explaining the present invention only, rather than limiting the present invention.

Figure 1:
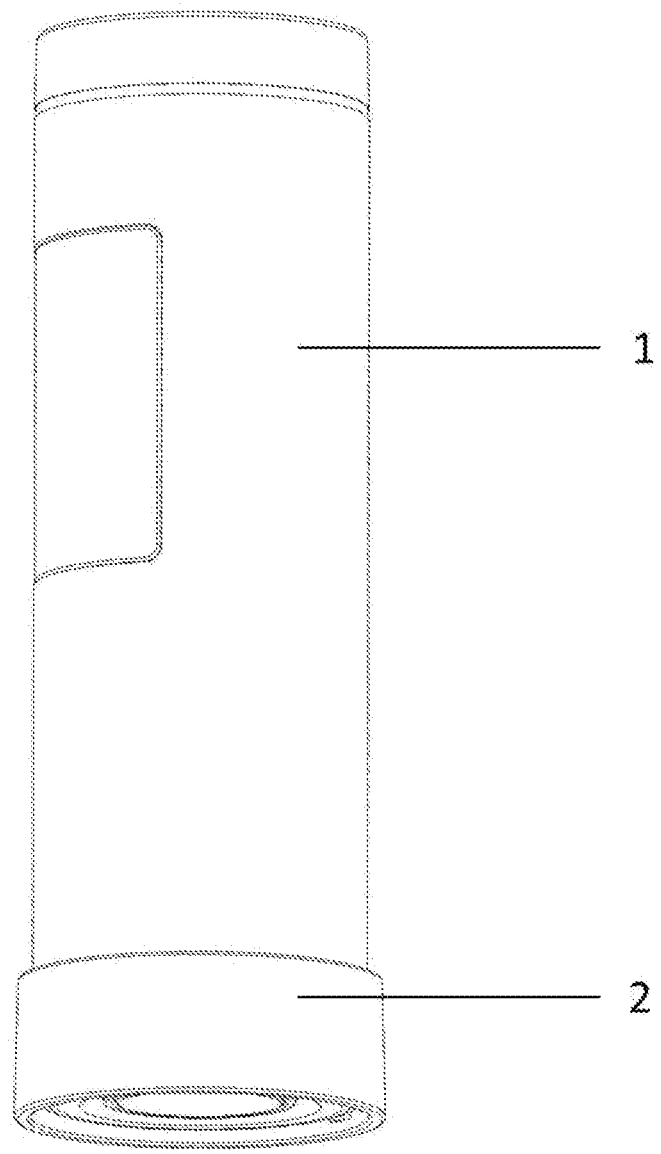
FIG. 1 is an overall structural view of the present invention.
Figure 2:
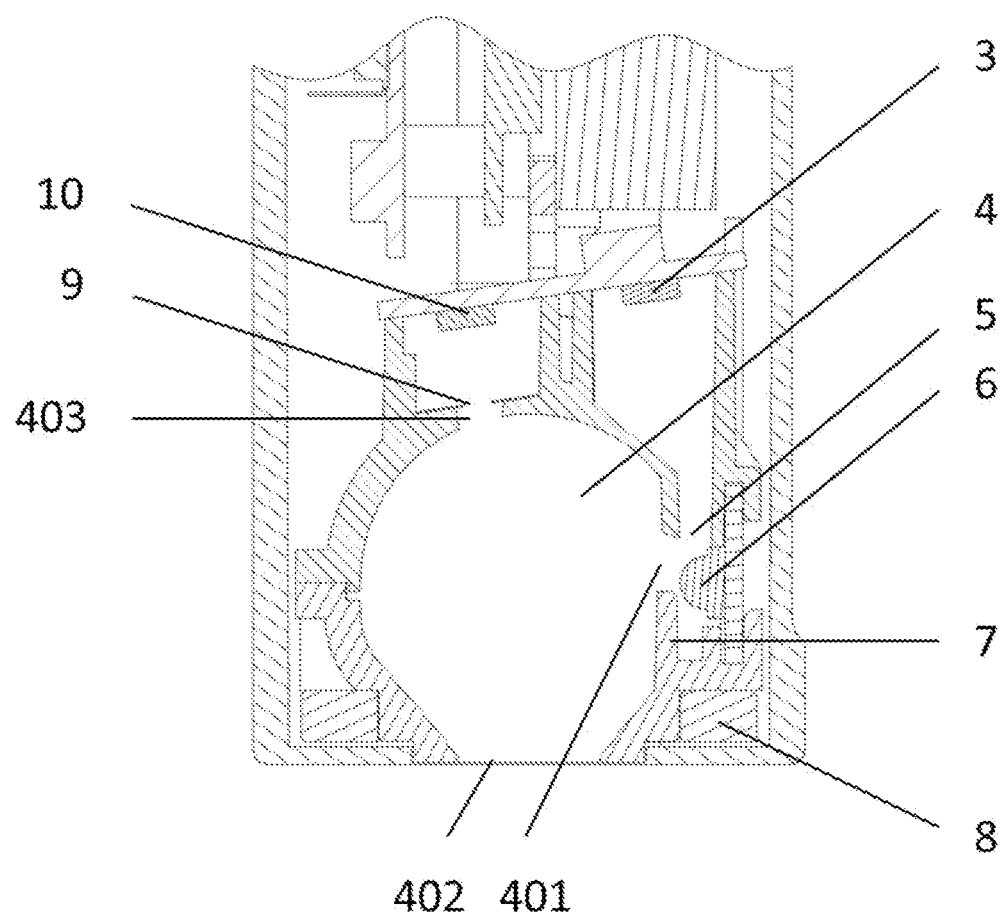
FIG. 2 is a sectional view of a part of a main unit in the present invention.
Figure 3A:
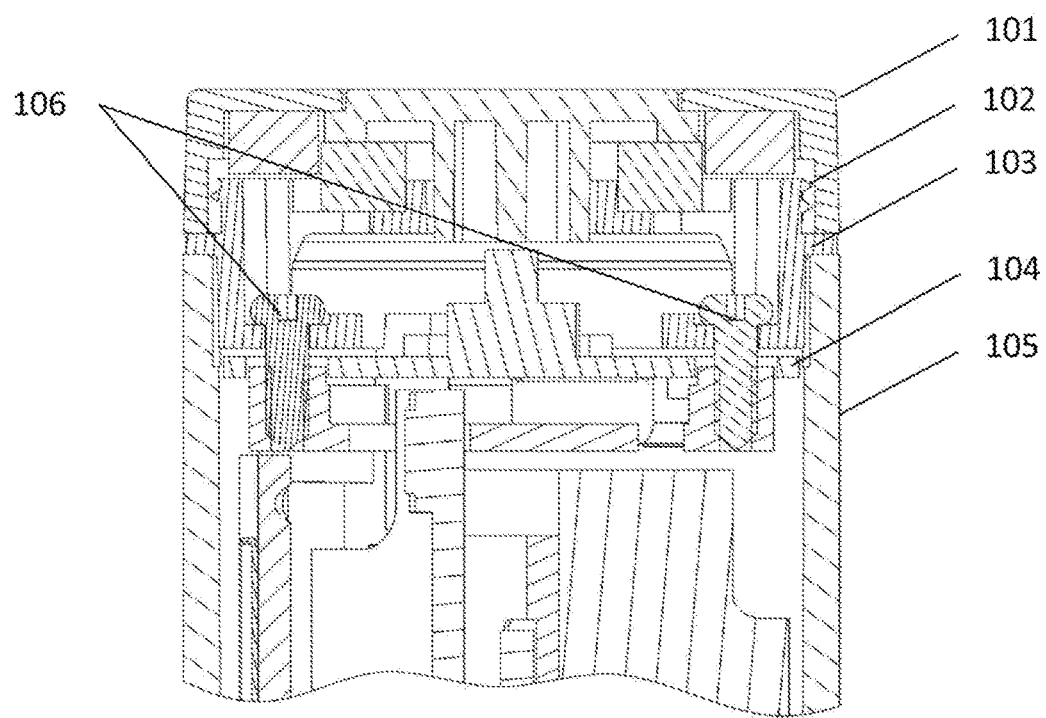
FIG. 3A is a sectional view of a top of a main unit in the present invention.
Figure 3B:
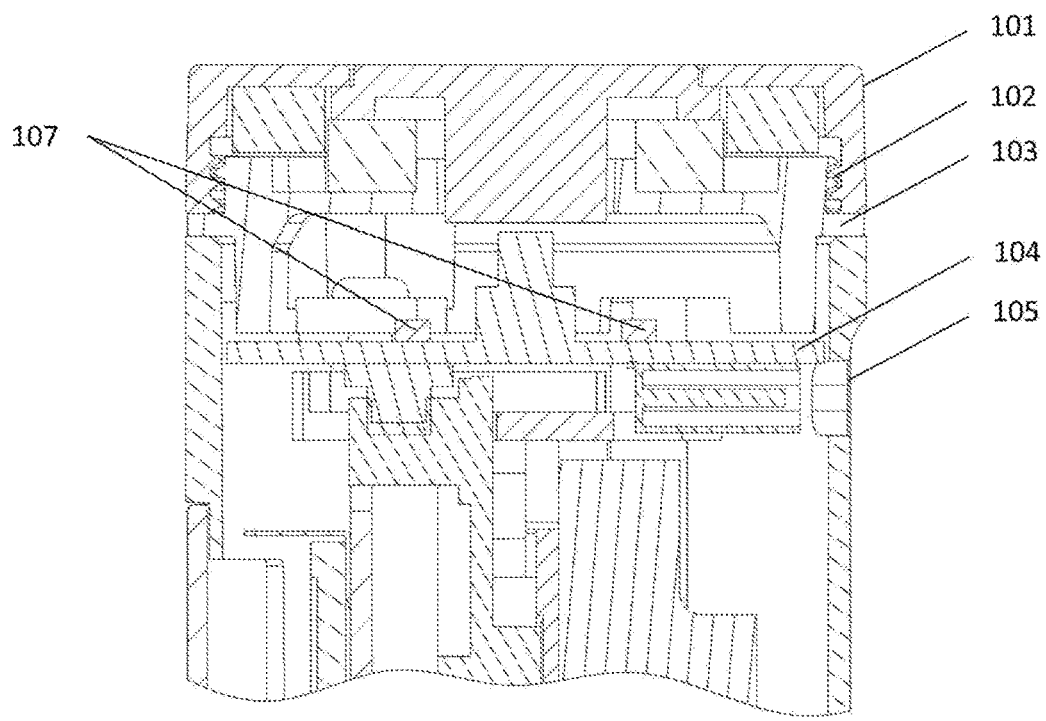
FIG. 3B is a sectional view of a top of a main unit after angle rotation in the present invention.
Figure 4A:
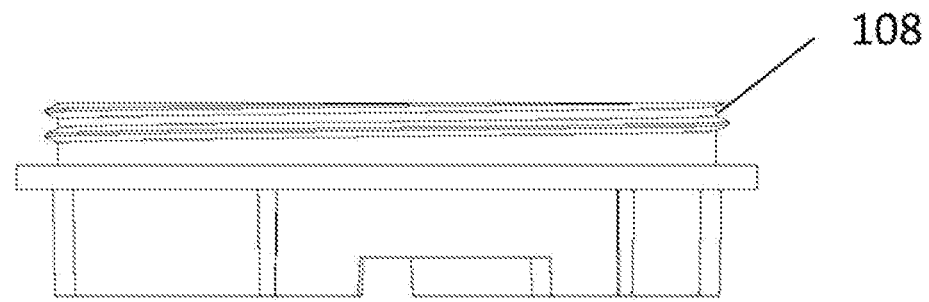
FIG. 4A is a side view of a light guide ring in the present invention.
Figure 4B:
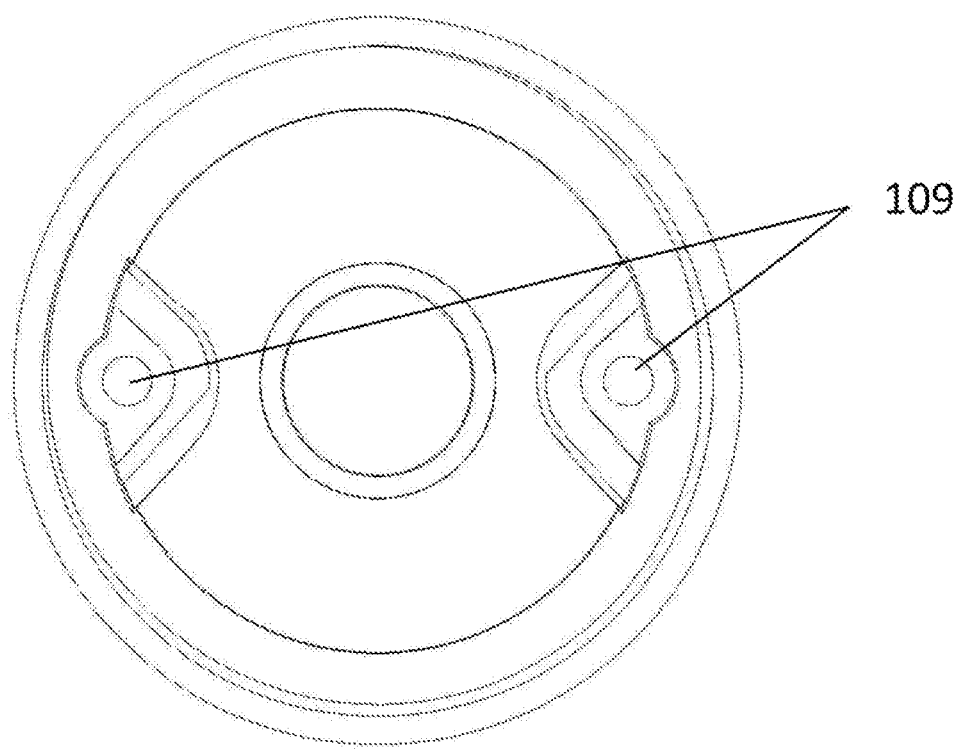
FIG. 4B is a top view of a light guide ring in the present invention.
Figure 5:
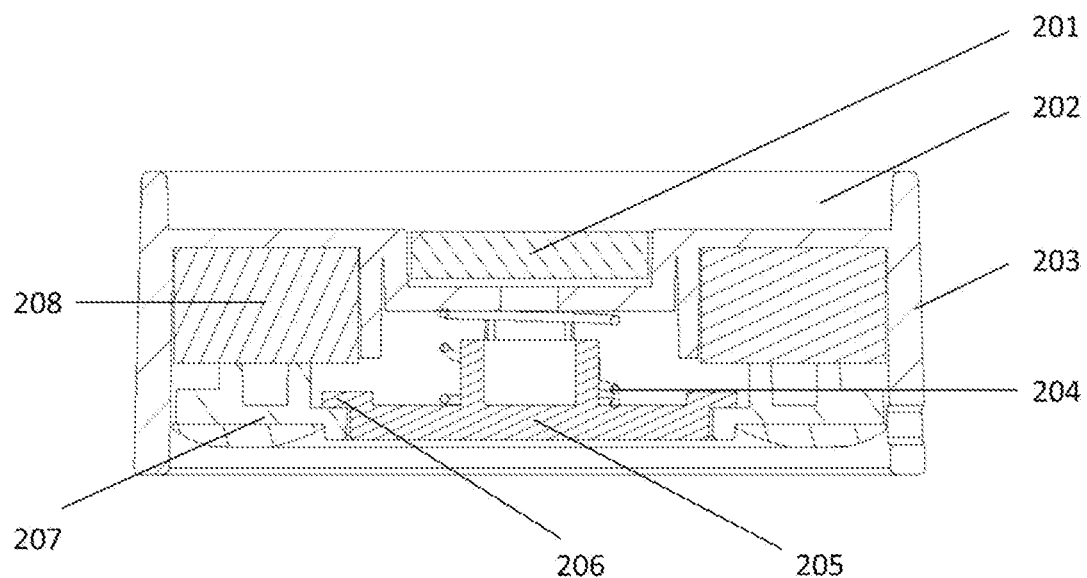
FIG. 5 is a sectional view of a calibration box in the present invention.
Figure 6:
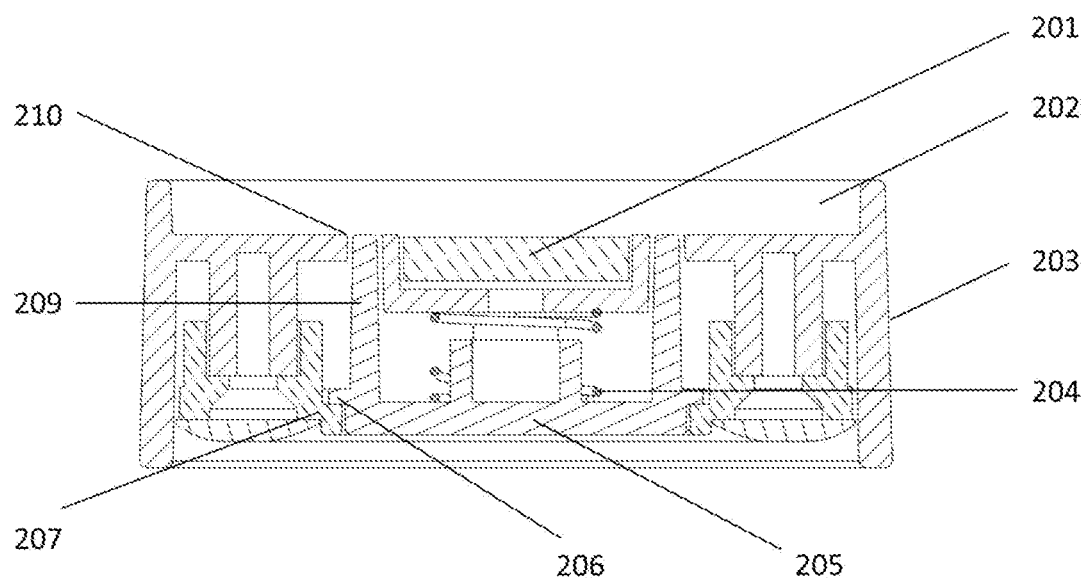
FIG. 6 is a sectional view of a calibration box after angle rotation in the present invention.
Figure 7:
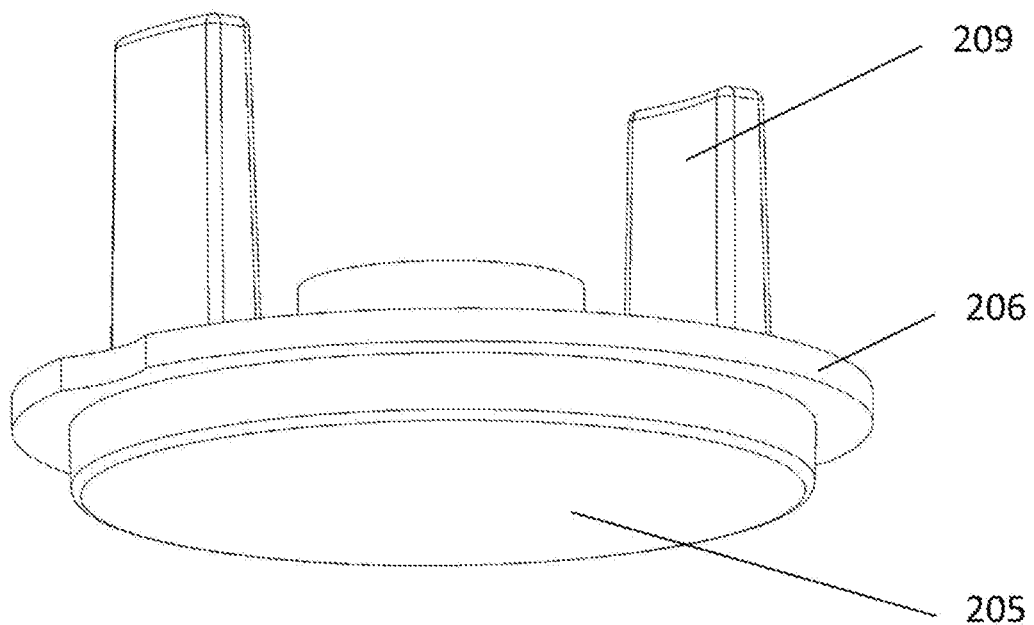
FIG. 7 is a structural view of a button in the present invention.
Figure 8A:
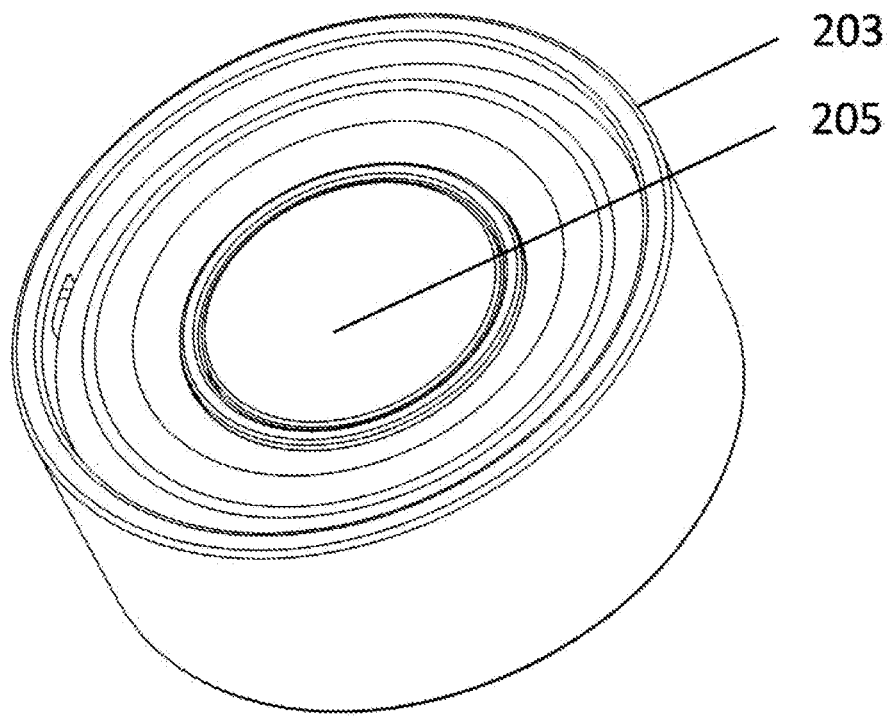
FIG. 8A is a view of a bottom of a calibration box in the present invention.
Figure 8B:
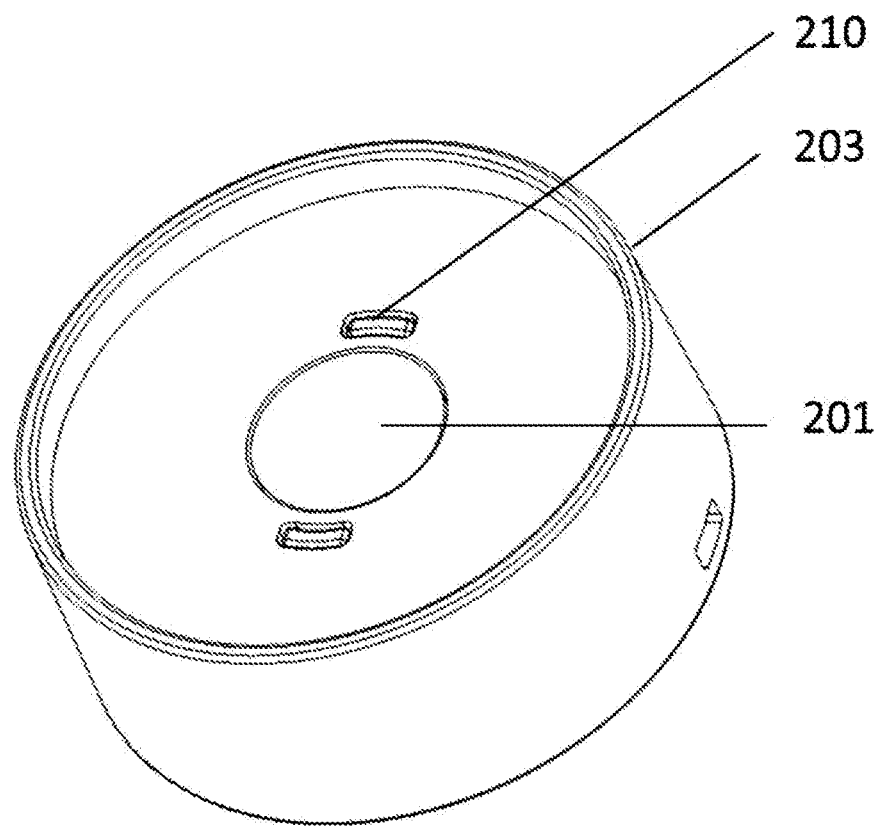
FIG. 8B is a view of a top of a calibration box in the present invention.
Figure 9:
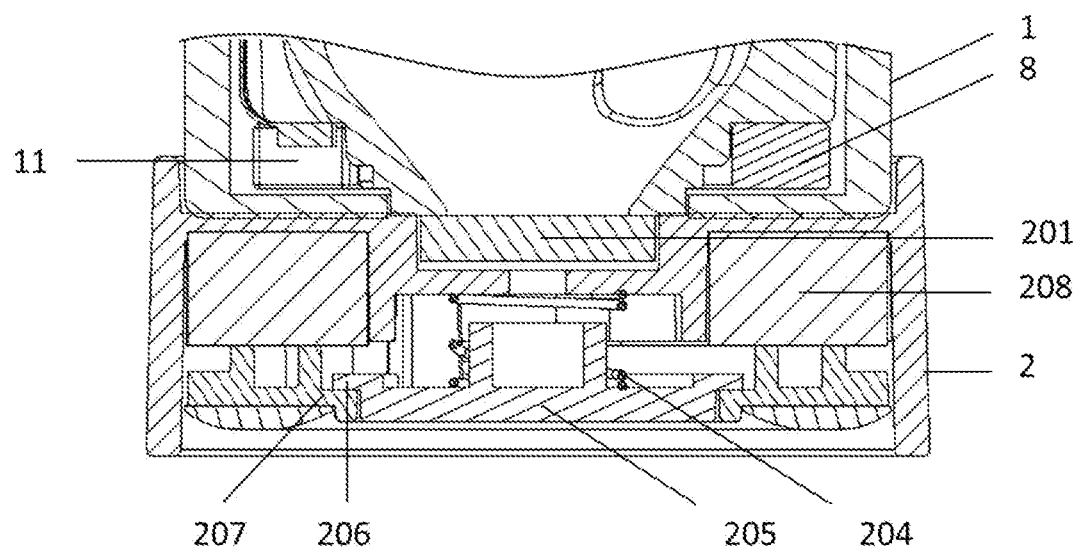
FIG. 9 is a sectional view of calibration state in the present invention.

As shown in FIGS. 1 and 2, a colorimeter based on a multichannel spectrum includes a main unit 1 and a calibration box 2, wherein the main unit 1 adopts a D/8 integrating sphere 4 (diffuse reflection illumination of a light source/a sensor receives signals at an angle of 8°) including a specular light measurement structure.

The integrating sphere 4 includes an upper hemisphere and a lower hemisphere with a diameter of 20 mm. A circular hole with a diameter of 8 mm as a measuring port 402 is formed in a bottom of the lower hemisphere of the integrating sphere 4. A light-through hole 401, in which a visible light (400-700 nm) full-spectrum LED light source 6 is placed, is formed in a side of the integrating sphere 4, to ensure that all wavelengths within a measurement range have spectral energy; a light barrier 7 is arranged between the LED light source 6 and the lower hemisphere of the integrating sphere 4 to prevent light source 6 from directly irradiating to the measuring port 402. A highly reflective material is sprayed on an inner wall of the integrating sphere 4, with a reflectivity of larger than or equal to 98% within a measured wavelength range; when the light source 6 is illumined, light directly irradiates to the inner wall of the integrating sphere 4, forms 360° uniform luminance of the whole sphere through multiple reflections by the highly reflective material on the inner wall of the integrating sphere 4, and irradiates to a surface of the measured sample.

A detection hole is formed at an 8° angle offset from a normal line of the measuring port 402 on the upper hemisphere of the integrating sphere 4. Besides, on an external surface of the upper hemisphere, a diaphragm piece 9 with a thickness of 0.1 mm and an aperture of 1.5 mm is placed at an upper part of the detection hole 403. A main sensor 10 is placed above the diaphragm piece 9, configured to measure the measured sample. Wherein a sensor light input hole, a diaphragm and the measuring port 402 are coaxial in center, and their coaxial lines form an 8° angle to the normal line of the measuring port 402. The diaphragm is arranged outside the upper hemisphere of the integrating sphere 4, configured to limit a measurement area of the sensor, and ensure that only reflected light from the measuring port 402 can enter the sensor. Light from the inner wall of the integrating sphere 4 cannot enter the sensor.

A light output hole 5 is formed in the light source 6 of the upper integrating hemisphere, and an auxiliary sensor 3 is placed at an upper end of the light output hole 5, configured to measure fluctuation of the light source 6.

The calibration of traditional colorimeters and color photometers needs to manually fasten or press the main unit 1 and the calibration box 2, and abnormal calibration may occur because the main unit 1 is not pressed against the calibration box 2, causing a deviation in measured data, and a manual button is required for calibration.

As shown in FIGS. 5-9, the calibration box 2 can be securely attracted to the measuring port 402 of the main unit 1, and the main unit 1 automatically senses the calibration box 2 and automatically performs a calibration function. Moreover, in non-calibration state, the calibration box 2 can be placed at a top end of the main unit 1 instead of an original measurement button 12 at a top end of the main unit 1, facilitating carrying and storage of the calibration box 2, and avoiding loss of the calibration box 2.

The calibration box 2 includes a housing 203, a white board 201, a spring 204, a button 205, magnets 208 and a button pressing plate 207. A stepped notch 202 jacketed with a bottom of the main unit 1 is formed inside a top of the housing 203; the white board 201 is arranged at an upper part of the calibration box 2, and one side of the white board 201 is flush with the stepped notch 202; 6 magnets 208 are uniformly placed in the calibration box 2 at 360° by taking the white board 201 as a center; a spring 204 is placed at a bottom of the white board 201, a button 205 is placed at a bottom of the spring 204, and a protrusion 206 matched with the button pressing plate 207 is arranged at an edge of the button 205; the button pressing plate 207 is fixed inside the housing 203 through a screw, configured to press against the button 205 and prevent the button 205 from ejecting down, and in addition, the button pressing plate 207 fixes the magnets 208 by pressing to prevent the magnets 208 from vertical displacements.

The white board 201 uses a white ceramic (zirconia or aluminum oxide) material, and mirror polishing is performed on its surface, so as to ensure its surface color is uniform, dirt-proof and scratch-resistant, and ensure stability of its color in a long-term use process.

The button 205 has two legs 209, and two calibration box holes 210 are formed in a top of the calibration box 2, and the calibration box holes 210 are slightly larger than the legs 209 of the button 205; during installation, the button 205 presses the upper spring 204 and the legs 209 are aligned with the calibration box holes 210; after installation, the button 205 presses against the button pressing plate 207 under a downward force of the spring 204, and at this time, the legs 209 are flush with an upper surface of the calibration box 2 with the white board 201; when a user presses the button 205, the legs 209 will pass through the calibration box holes 210, and tops of the legs 209 will protrude from the upper surface of the calibration box 2 with the white board 201.

At the bottom of the main unit 1, an opened hoop 8 correspondingly matched with the magnets 208 of the calibration box 2 is installed at 270° around the integrating sphere 4; when the calibration box 2 is close to the bottom of the main unit 1, the calibration box 2 is automatically jacketed with the bottom of the main unit 1 through magnetic attraction. Additionally, outside the integrating sphere 4, a magnetic induction sensor 11 (such as Hall sensor and reed switch) is installed at an opening of the opened hoop 8; when the calibration box 2 is attracted to the main unit 1, the magnetic induction sensor 11 will output a signal to a MCU of the main unit 1 for automatic calibration.

An inner diameter of the calibration box 2 is slightly larger than an outer diameter (0.2 mm) of the main unit 1; when the calibration box 2 is attracted to the main unit 1, because a size (10 mm) of the white board 201 is larger than that of the measuring port 402 (8 mm), the white board 201 completely covers the measuring port 402.

Figure 11:
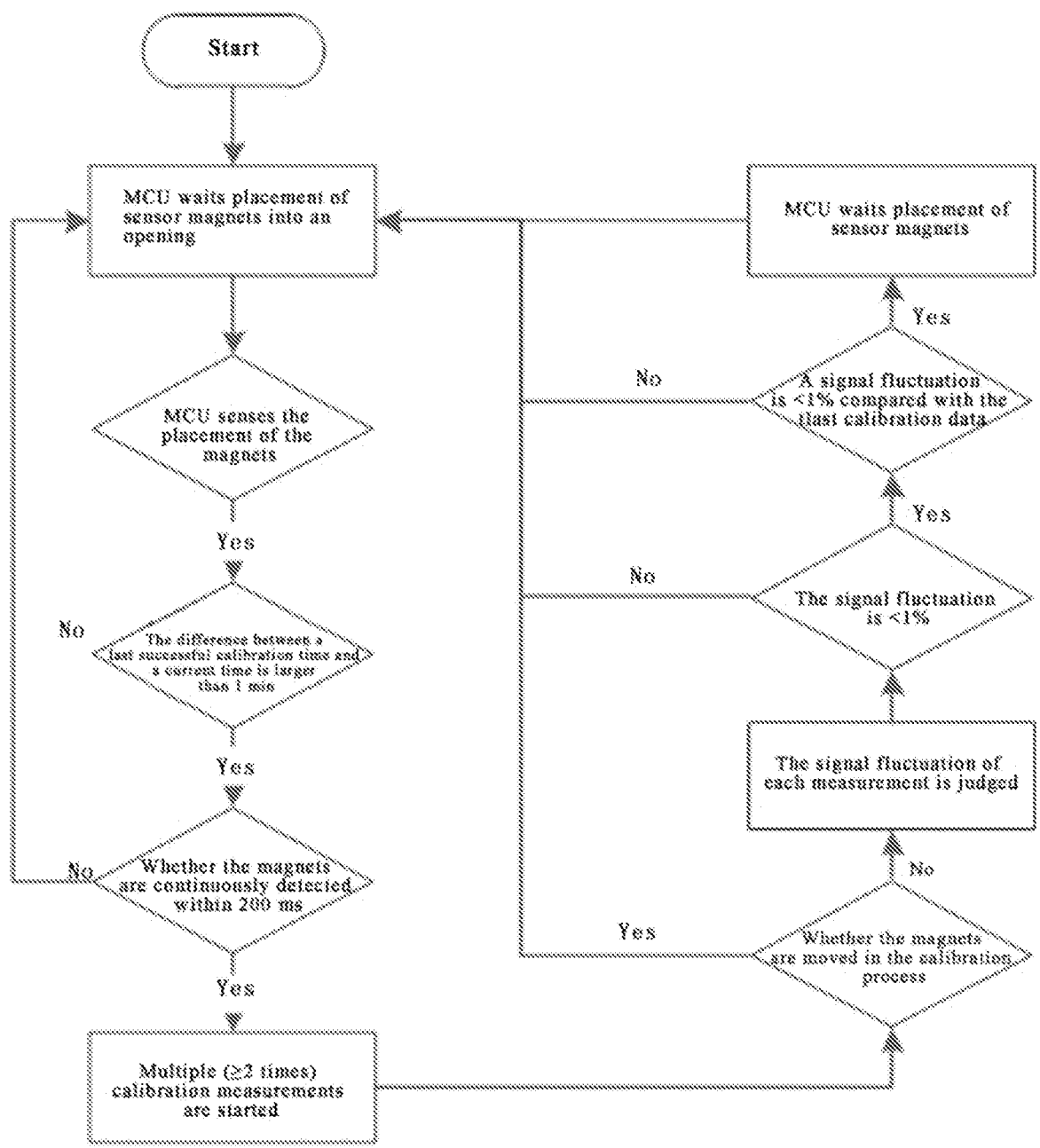
FIG. 11 is a flow chart of a magnetic induction calibration method in the present invention.

As shown in FIG. 11, because magnet induction calibration is used, when a user is close to the magnets 208 or removes the calibration box 2 in a calibration process, it will cause abnormal calibration data. For these situations, an induction calibration method is adopted and includes the following steps:
(1) a MCU waits placement of a magnetic induction sensor 11 into an opening;
(2) the MCU senses the placement of magnets 208, and judges whether a difference between a last calibration time and a current time is larger than an interval threshold (such as 1 min); if yes, (3) proceeds, or the process returns to (1);
(3) whether the magnets 208 are placed is continuously detected within a continuous threshold (such as 200 ms); if yes, (4) proceeds, or the process returns to (1);
(4) multiple calibration measurements (>2 times) are performed to judge whether the magnets 208 are moved or pushed aside in the calibration process; if not, (5) proceeds, or the process returns to (1);
(5) whether a signal fluctuation between the calibration measurement is less than a fluctuation threshold (such as <1%) is judged; if yes, (6) proceeds, or the process returns to (1); and
(6) an average value of the multiple calibration measurements is compared with a last calibrated signal; the calibration succeeds when the signal fluctuation is less than the fluctuation threshold (such as <1%), and the average value of the multiple calibration measurements and a last calibration measurement time of this round are saved, and (1) proceeds, or the process returns to (1) directly.

Figure 10:
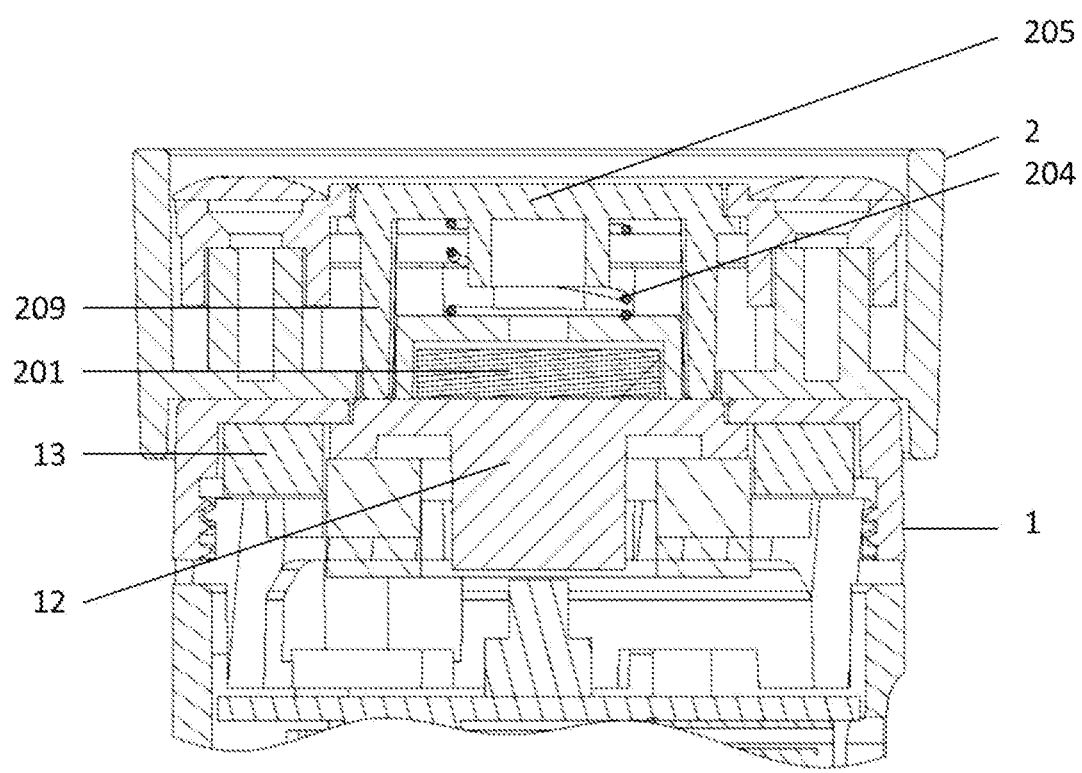
FIG. 10 is a sectional view of non-calibration state in the present invention.

The calibration box 2 can also be placed at a top of the main unit 1, instead of the measurement button 12 of the main unit 1, and can effectively protect the white board 201 and prevent loss of the calibration box 2. A circle of hoop 13 (360°) correspondingly matched with the magnets 208 of the calibration box 2 is placed inside the top of the main unit 1, the measurement button 12 (with a diameter of larger than that of the button 205 of the calibration box 2) is arranged at the top of the main unit 1, and a circle of elastic foam (or spring) is arranged below the measurement button 12, so that the measurement button 12 suffers from an upward elastic force; the protrusion 206 matched with an inner surface of the top of the main unit 1 is arranged at an edge of the measurement button 12, to prevent the measurement button 12 from ejecting up, and an upper surface of the measurement button 12 is flush with a surface of the housing 203. As shown in FIG. 10, the calibration box 2 is securely jacketed at the top of the main unit 1 through magnets when being placed reversely at the top of the main unit 1; when the button 205 of the calibration box 2 is pressed, the legs 209 protrude and press the measurement button 12, playing an effect of switch measurement instead of the measurement button 12.

As shown in FIGS. 3A, 3B, 4A and 4B, a circle (360°) of light guide ring 103 is arranged near the main unit 1 close to the top. The realization principle is as follows:

The light guide ring 103 is made of semitransparent light guide material, with an external thread 108 arranged at its upper parts, configured to fix an upper cover 101 (an internal thread 102 is arranged inside the upper cover 101) and the light guide ring 103. Two threaded fixing holes 109 are formed inside a lower part of the light guide ring 103 which is fixed to a main body 105 through connecting screws 106. A PCB board 104 is arranged between the light guide ring 103 and the main body 105, a tricolor (R, G, B) LED lamp 107 is arranged at each 90° on a surface of the PCB board 104, and the LED lamps 107 illuminate up. When four LED lamps 107 come on simultaneously, the light irradiates to an inner surface of the light guide ring 103; because the light guide ring 103 is made of semitransparent light guide material, the light will diffuse outwards with a shape of the semitransparent light guide ring 103, and an effect of 360° overall luminance can be seen from an outer surface of the main unit 1. This structure can ensure an integrity of the main unit 1 while achieving 360° overall uniform luminance, and will not cause fixing failure due to 360° overall luminance. Such lamps are configured to indicate different working states; different lamps will be on in different states, e.g., the LED lamps are blue in measurement state, green in calibration state, and red in charging state.

A traditional colorimeter measures XYZ tristimulus values and uses X, Y and Z optical filters+photocells as a detector. For simulating the XYZ tristimulus values to obtain a spectral response, the optical filters are generally coated or bonded with colored glass, causing a large error. Moreover, the mode of optical filters+photocells can only simulate a response curve of one standard light source (such as D65 and A) and angle (such as CIE1931 2° field angle and CIE1964 10° field angle), and fails to switch between various light sources and angles.

A spectrophotometer adopts an optical grating for beam splitting, spectral reflectivity of a sample at an interval of 10 nm wavelength within a measurement range can be measured accurately, and the XYZ tristimulus value data can be calculated at various light sources/angles by using the reflectivity, but its cost is high.

For inaccurate measurement of the traditional colorimeter and high price of the spectrophotometer, a low-cost visible light (400-700 nm) 8-channel sensor is used. A reflectivity measuring method based on a multichannel spectrum can measure spectral reflectivity at an interval of 10 nm within 400-700 nm.

Figure 12:
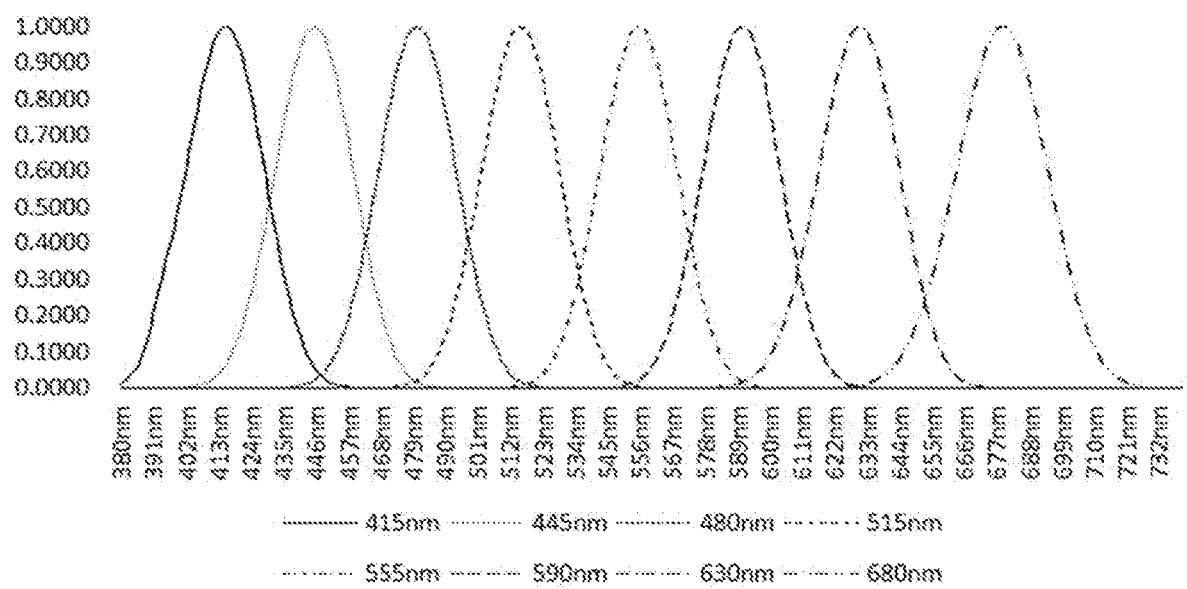
FIG. 12 shows a corresponding curve of a normalized spectrum of an 8-channel sensor in the present invention.

As shown in FIG. 12, an 8-channel spectral sensor (more preferably >8 channels) was selected within a visible light range (400-700 nm), and response curves of such 8 channels could uniformly cover 400-700 nm. Peak wavelengths of such 8 channels were 415 nm, 445 nm, 480 nm, 515 nm, 555 nm, 590 nm, 630 nm and 680 nm (other similar wavelengths were the same) respectively, and half-wave widths were 25-50 nm.

A reflectivity measuring method based on a multichannel spectrum included the following steps:

(1) standard reflectivity and corresponding 8-channel sampled data were arranged in a main unit 1:

1,000 (the more the better) standard colors (uniformly distributed from red, orange, yellow, green, cyan, blue, purple, white, gray and black) were prepared; such 1,000 standard colors were measured by the main unit 1 to obtain 8-channel data of each standard color:

$$S_{n,i}$$

n: 1-1,000; i: 1-8 (corresponding wavelengths were 415 nm, 445 nm, 480 nm, 515 nm, 555 nm, 590 nm, 630 nm and 680 nm respectively); 1,000 standard colors were measured by a standard machine to obtain 31 reflectivity data (at an interval of 10 nm within 400-700 nm) of each color;

$$T_{n,\lambda}$$

n: 1-1,000; λ: 400 nm, 410 nm . . . 690 nm, 700 nm.

(2) A measured sample was measured by the main unit 1 to obtain 8-channel target color data:

$$C_i$$

i: 1-8 (415 nm, 445 nm, 480 nm, 515 nm, 555 nm, 590 nm, 630 nm and 680 nm).

(3) The 1,000 standard colors built in the main unit 1 were traversed to find a standard color closest to the target color, and a difference between the target color and the standard color based on each channel of 8 channels was calculated as follows:

$$d_{n,i} = S_{n,i} - C_i$$

Total differences between the target color and the standard color were calculated as follows:

$$D_n = \sqrt{d_{n,1}^2 + d_{n,2}^2 + \ldots + d_{n,8}^2}$$

The total differences $D_n$ were ranked to obtain a minimum value position m, and $S_{m,i}$ and $T_{m,\lambda}$ corresponding to the minimum value were recorded.

(4) The 8-channel target color $C_i$ was calculated as 31-channel data $c_\lambda$, where $C_i$ was 8-channel data, and $W_i$ was wavelengths corresponding to the channels, which were 415, 445, 480, 515, 555, 590, 630 and 690; $k_i$, $b_i$ and $c_\lambda$ (i=1-7; i=7 was taken when i=8) were calculated with $C_i$ and $W_i$:

$$k_i = \frac{C_{i+1} - C_i}{W_{i+1} - W_i}$$

$$b_i = C_{i+1} - k_i * W_{i+1}$$

$$c_\lambda = k_i * \lambda + b_i$$

i was i when λ was closest to $W_i$.

(5) Similarly, the 8-channel advancing color $S_{m,i}$ was calculated as 31-channel data $s_\lambda$ (i=1-7; i=7 was taken when i=8):

$$k_i' = \frac{S_{m,i+1} - S_{m,i}}{W_{i+1} - W_i}$$

$$b_i' = S_{m,i+1} - k_i' * W_{i+1}$$

$$s_\lambda = k_i' * \lambda + b_i'$$

i was i when λ was closest to $W_i$.

(6) The reflectivity was calculated as follows:

$$R_\lambda = \frac{T_{m,\lambda}}{s_\lambda} * c_\lambda$$

Figure 13A:
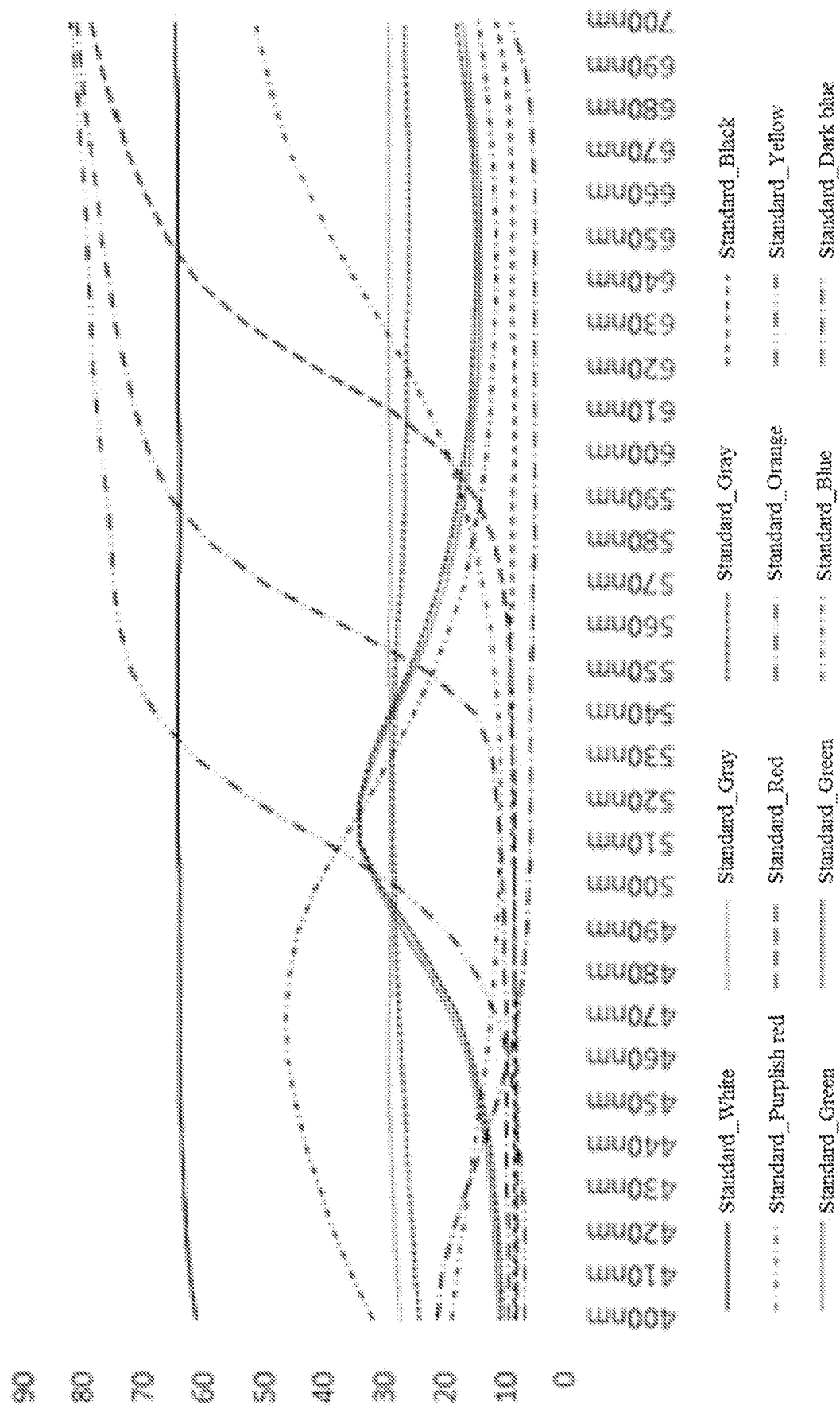
FIG. 13A shows a curve of standard reflectivity data (400-700 nm) of BCRA12 color bricks in the present invention.
Figure 13B:
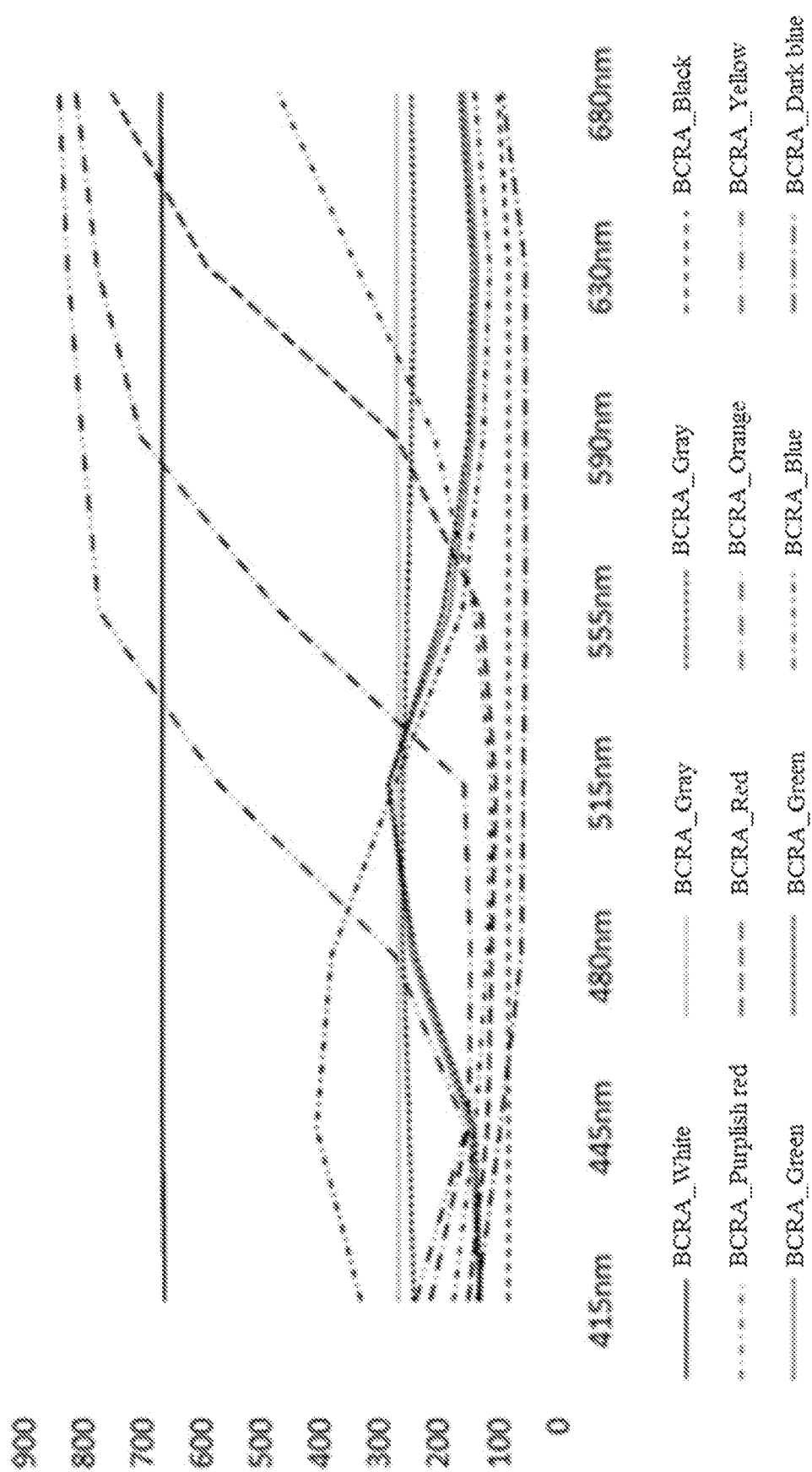
FIG. 13B shows a curve of measured 8-channel data of BCRA12 color bricks in the present invention.
Figure 13C:
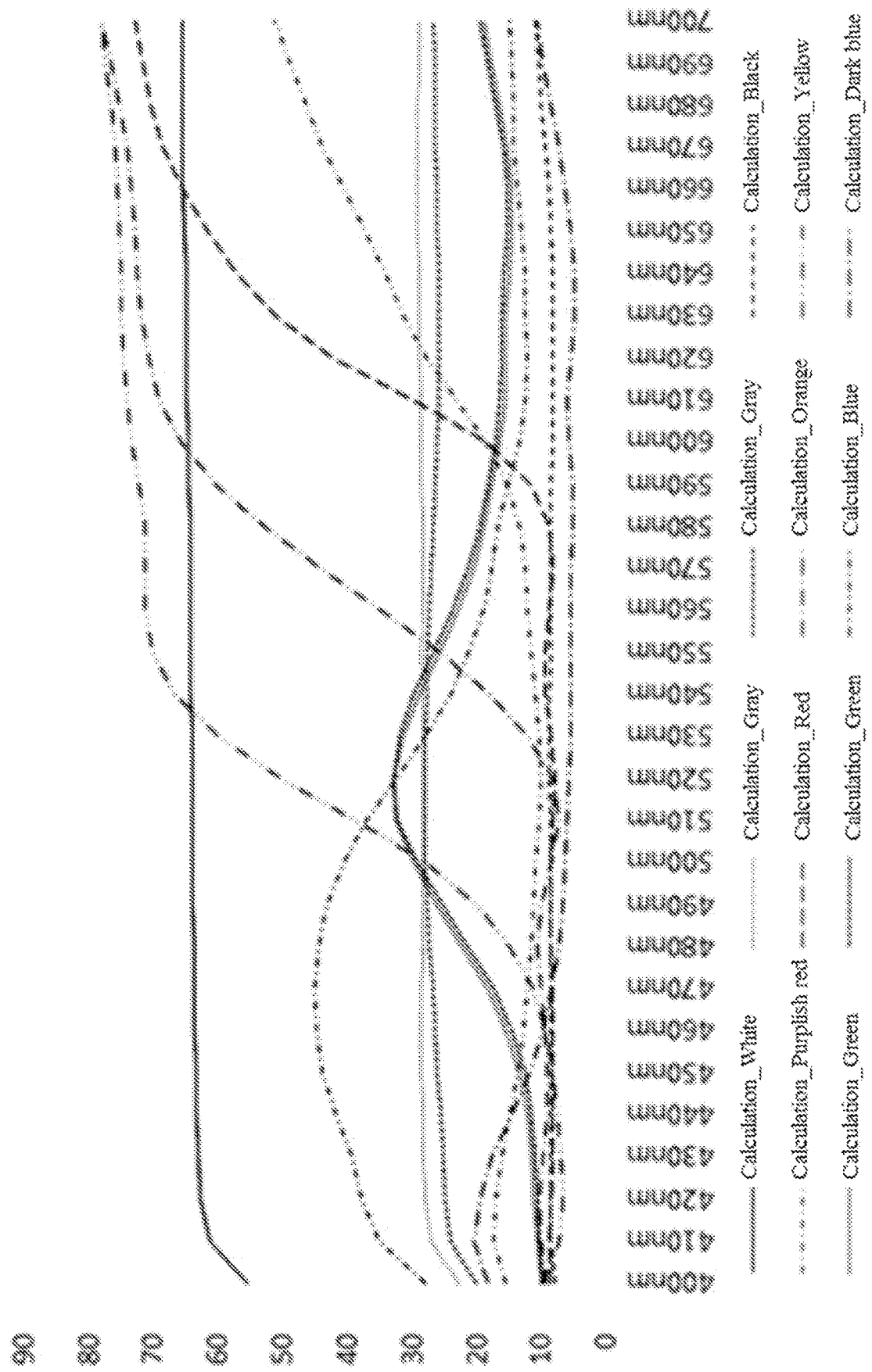
FIG. 13C shows a curve of reflectivity data (400-700 nm) of BCRA12 color bricks after calculation in the present invention.
Figure 14A:
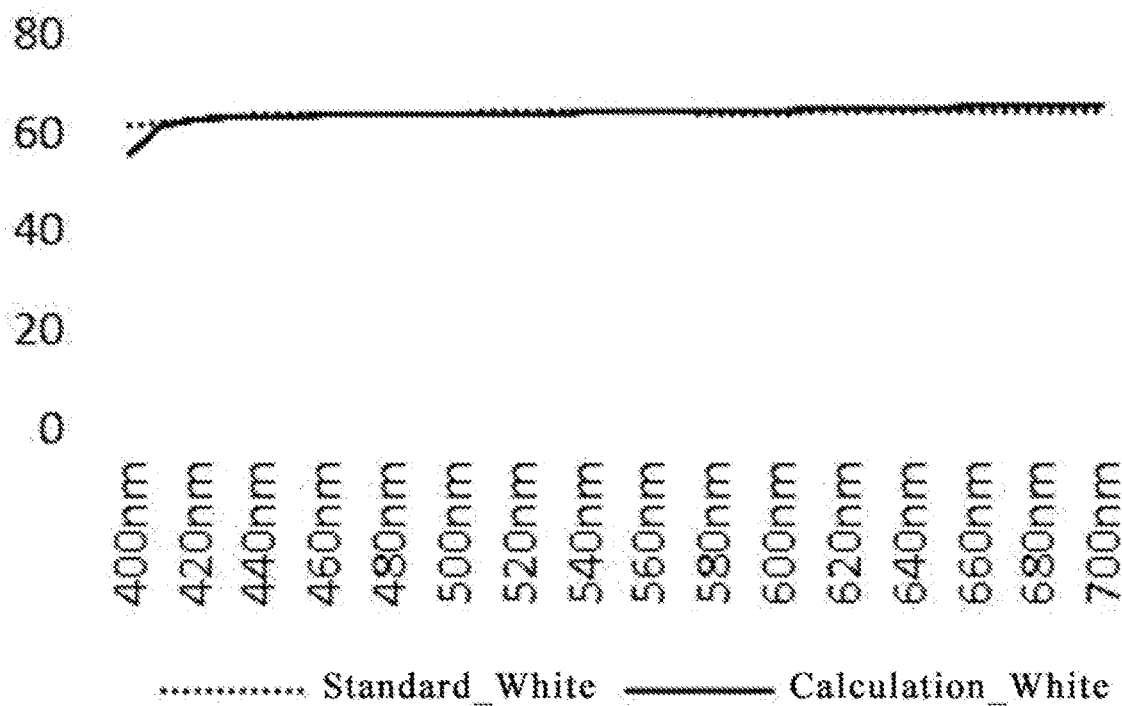
FIG. 14A shows a comparison between standard white reflectivity and calculated white reflectivity in the present invention.
Figure 14B:
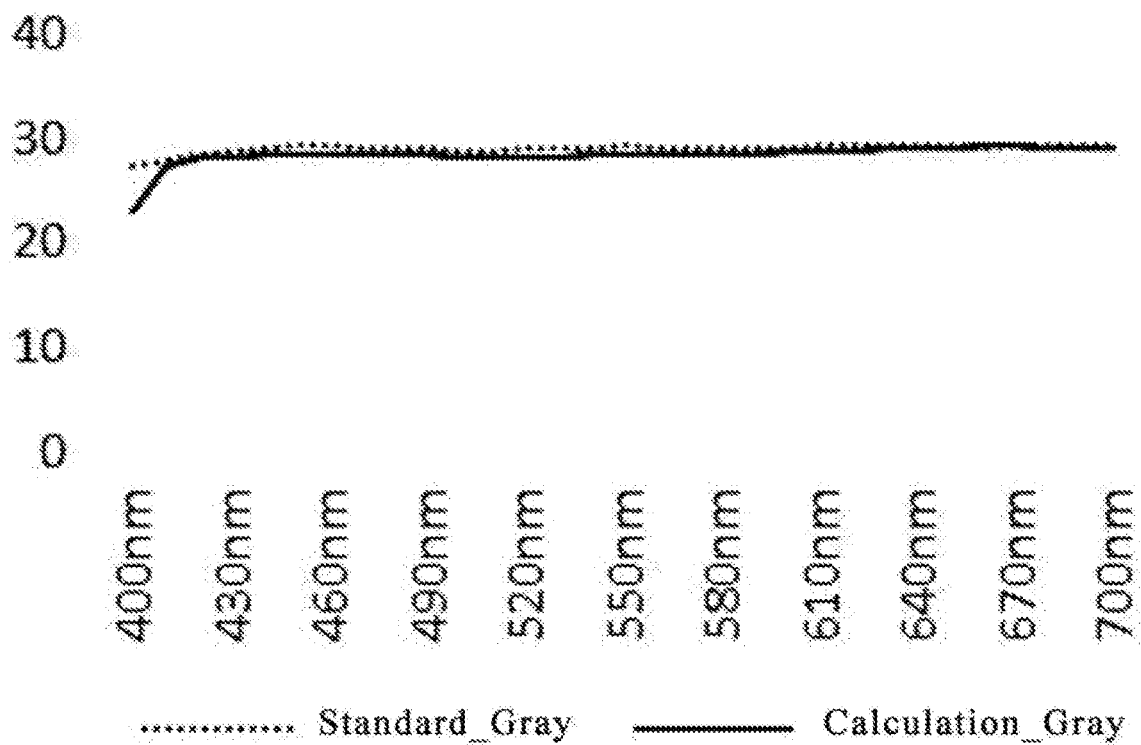
FIG. 14B shows a comparison between standard gray reflectivity and calculated gray reflectivity in the present invention.
Figure 14C:
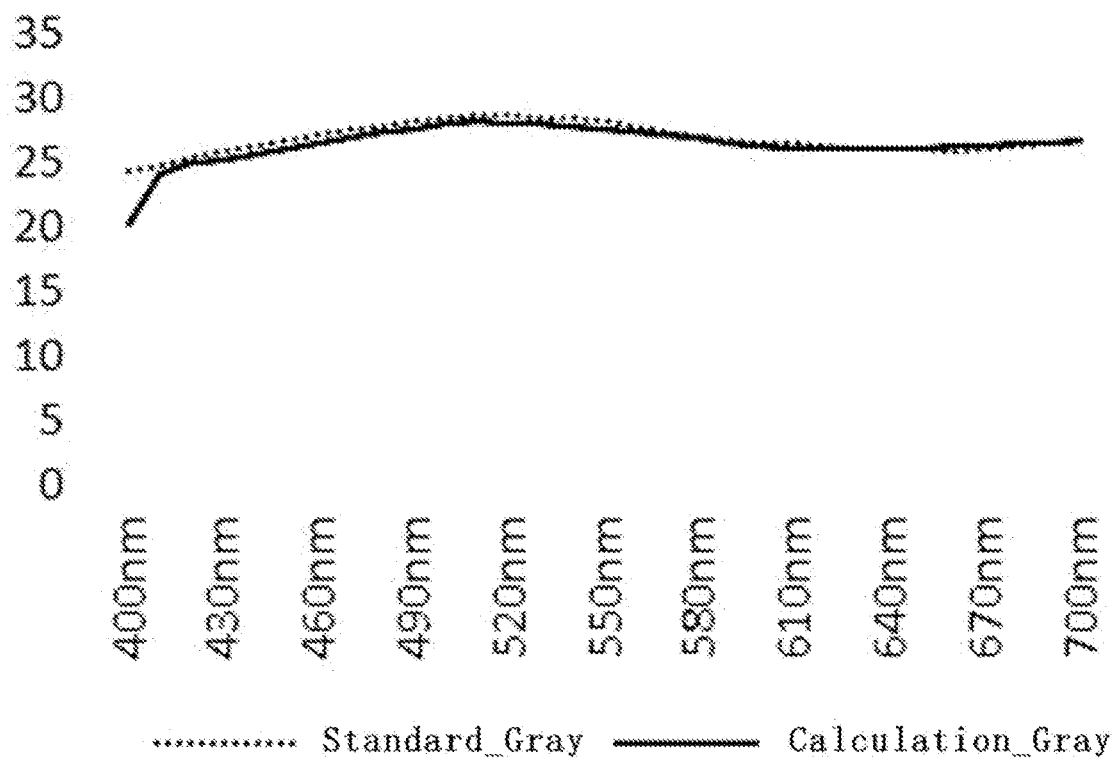
FIG. 14C shows a comparison between standard gray reflectivity and calculated gray reflectivity in the present invention.
Figure 14D:
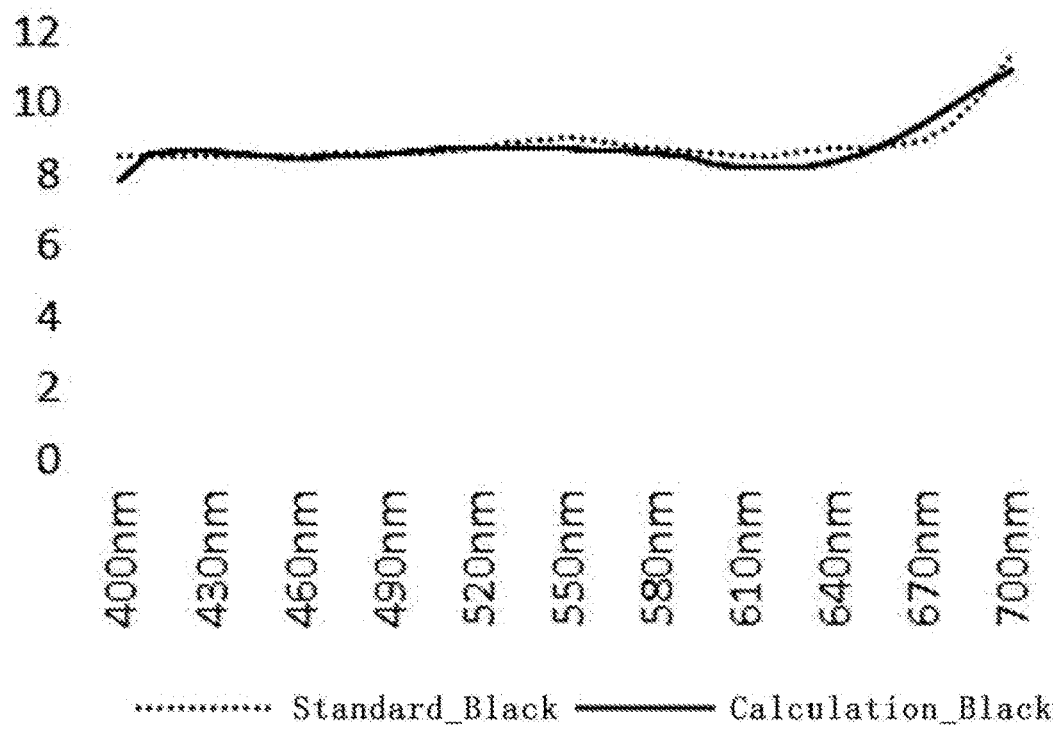
FIG. 14D shows a comparison between standard black reflectivity and calculated black reflectivity in the present invention.
Figure 14E:
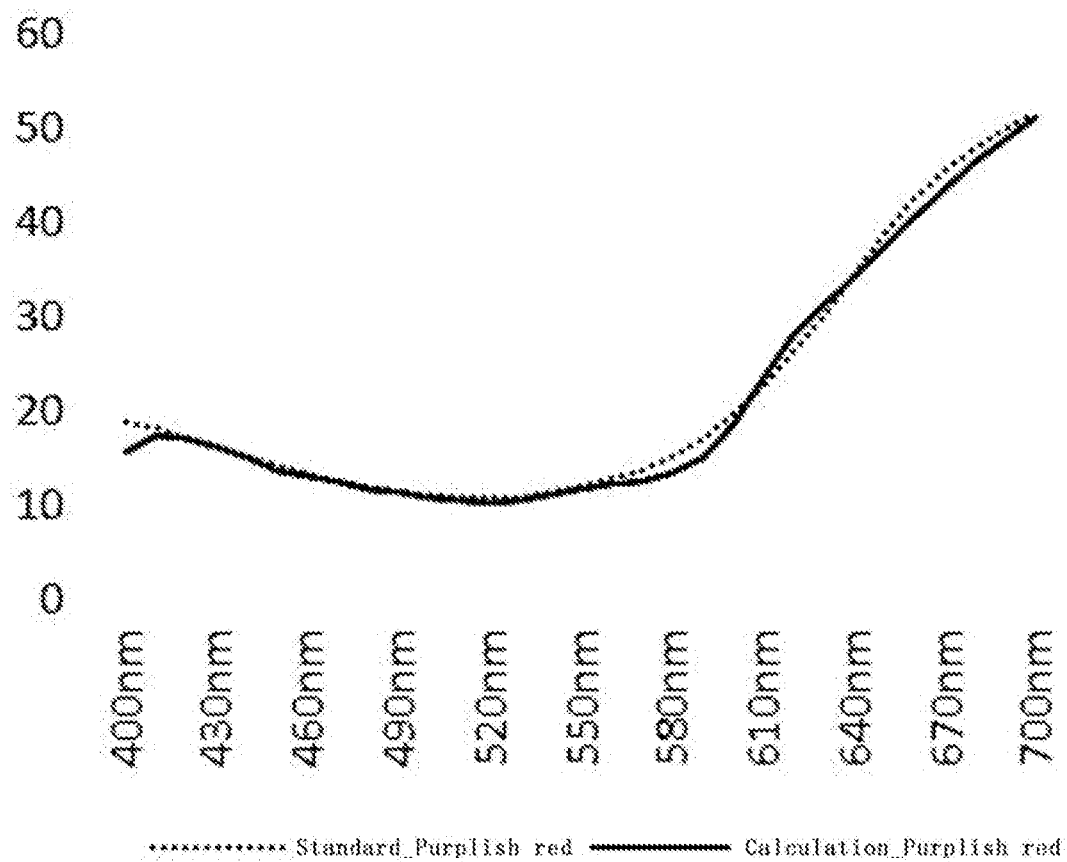
FIG. 14E shows a comparison between standard purplish red reflectivity and calculated purplish red reflectivity in the present invention.
Figure 14F:
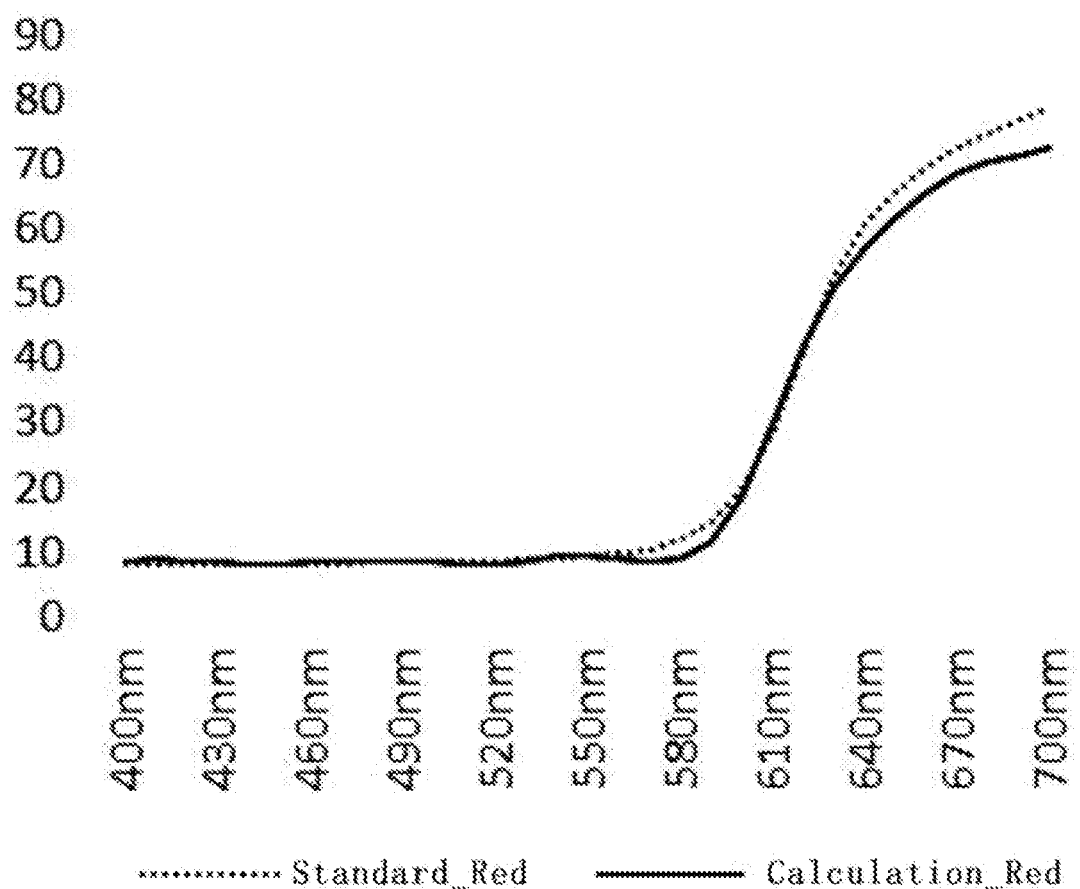
FIG. 14F shows a comparison between standard red reflectivity and calculated red reflectivity in the present invention.
Figure 14G:
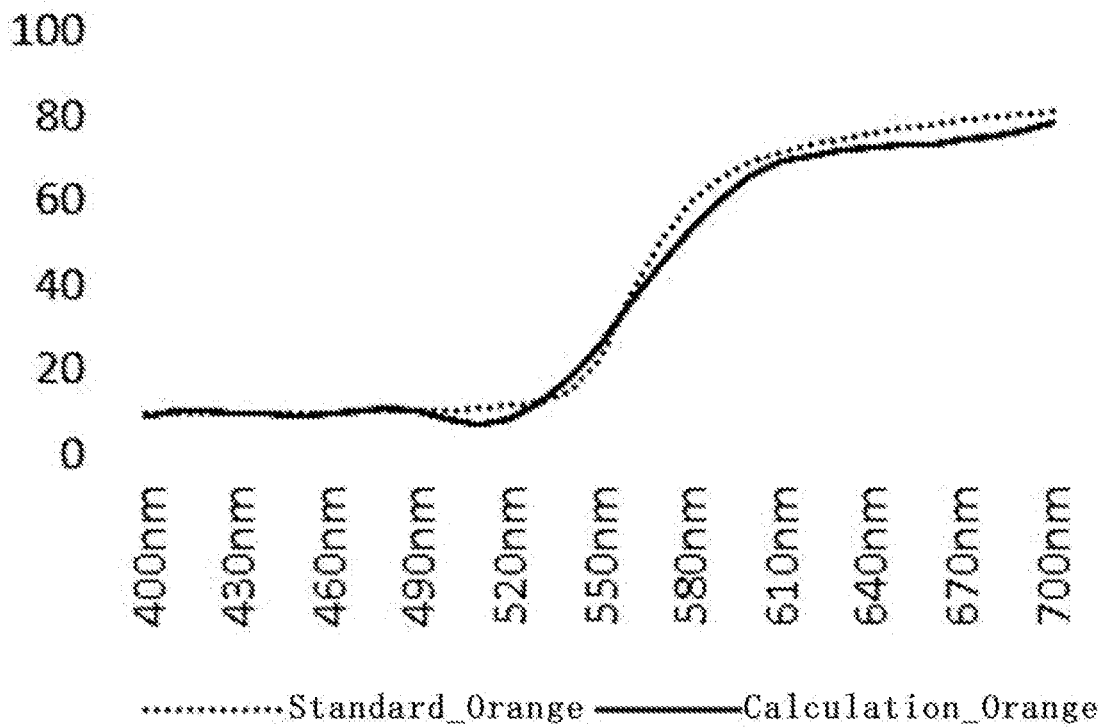
FIG. 14G shows a comparison between standard orange reflectivity and calculated orange reflectivity in the present invention.
Figure 14H:
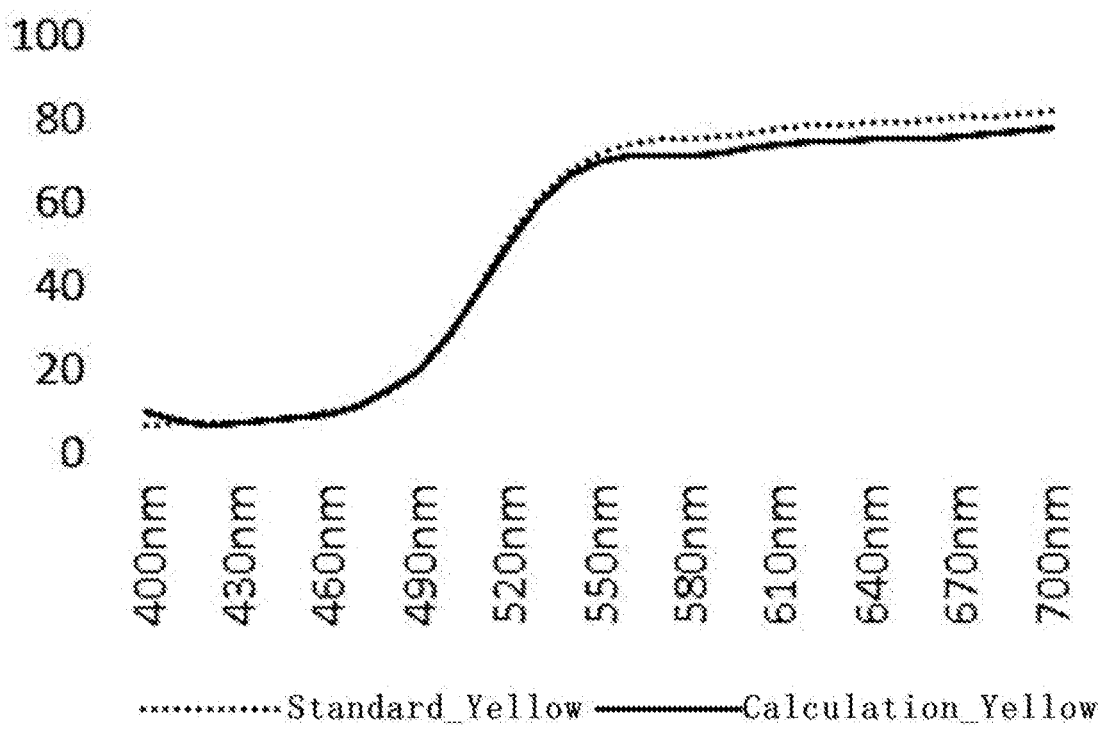
FIG. 14H shows a comparison between standard yellow reflectivity and calculated yellow reflectivity in the present invention.
Figure 14I:
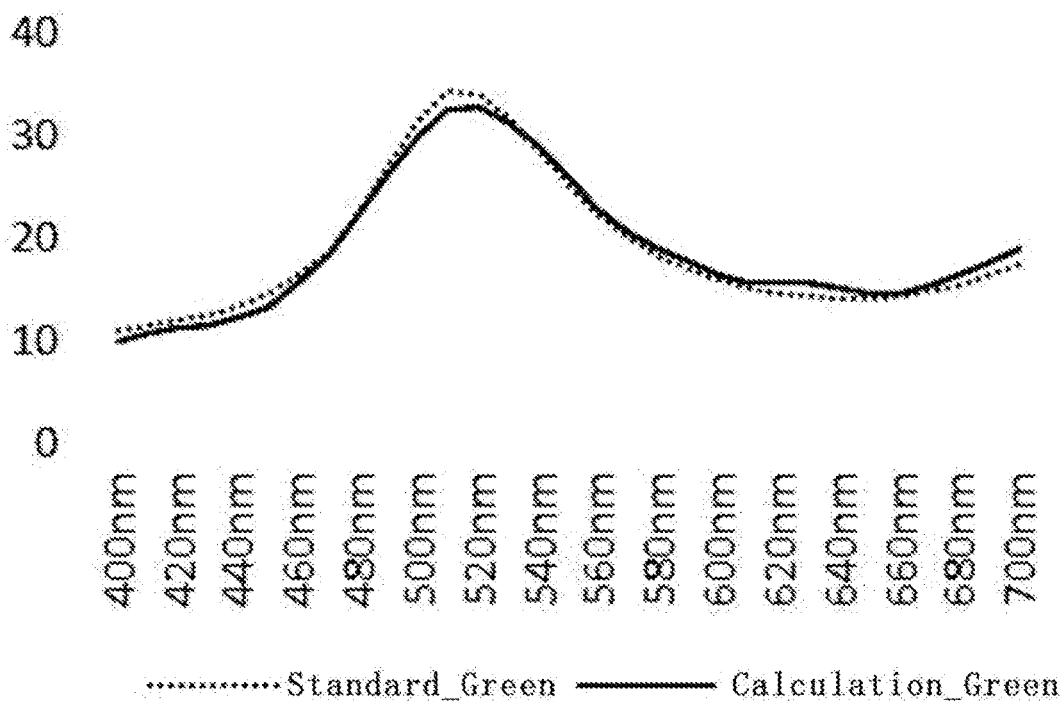
FIG. 14I shows a comparison between standard green reflectivity and calculated green reflectivity in the present invention.
Figure 14J:
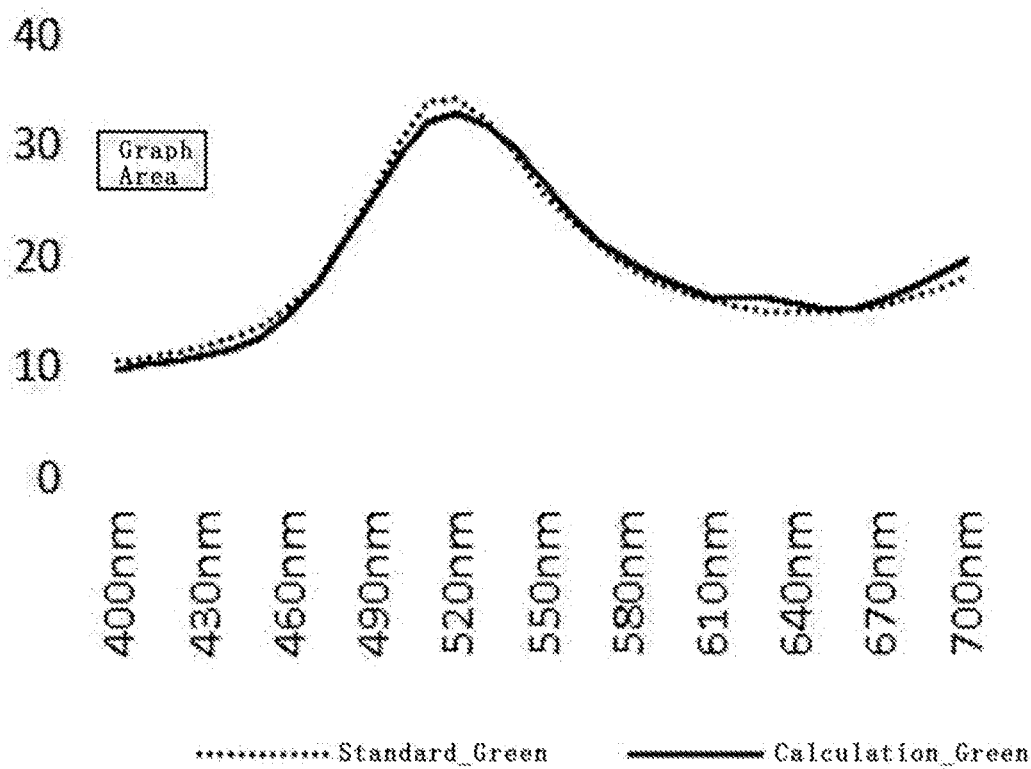
FIG. 14J shows a comparison between standard green reflectivity and calculated green reflectivity in the present invention.
Figure 14K:
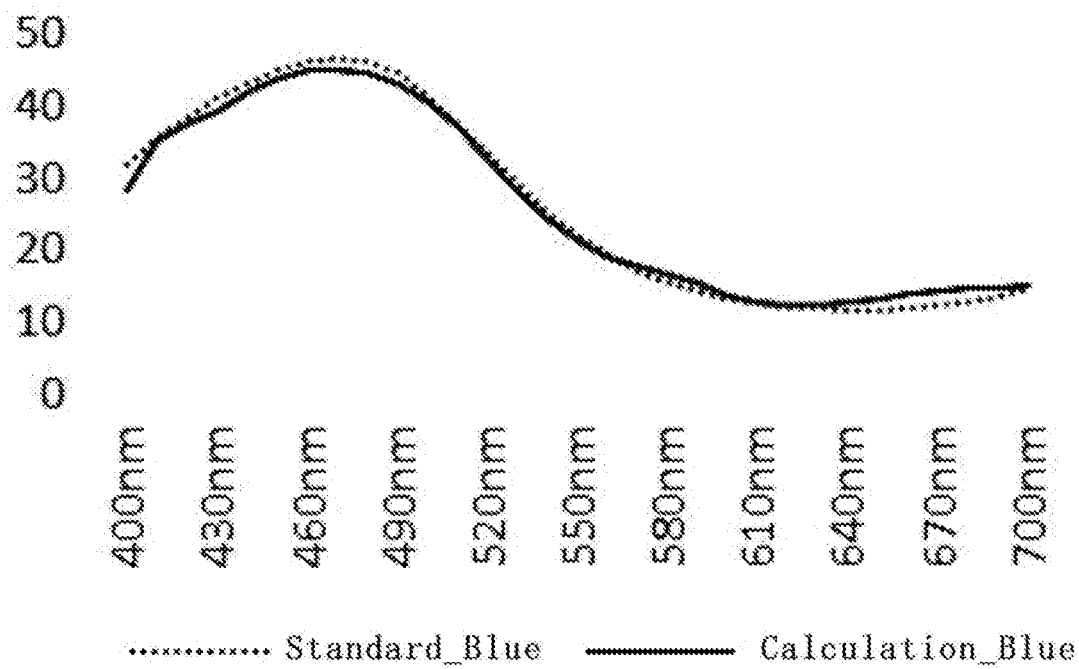
FIG. 14K shows a comparison between standard blue reflectivity and calculated blue reflectivity in the present invention.
Figure 14L:
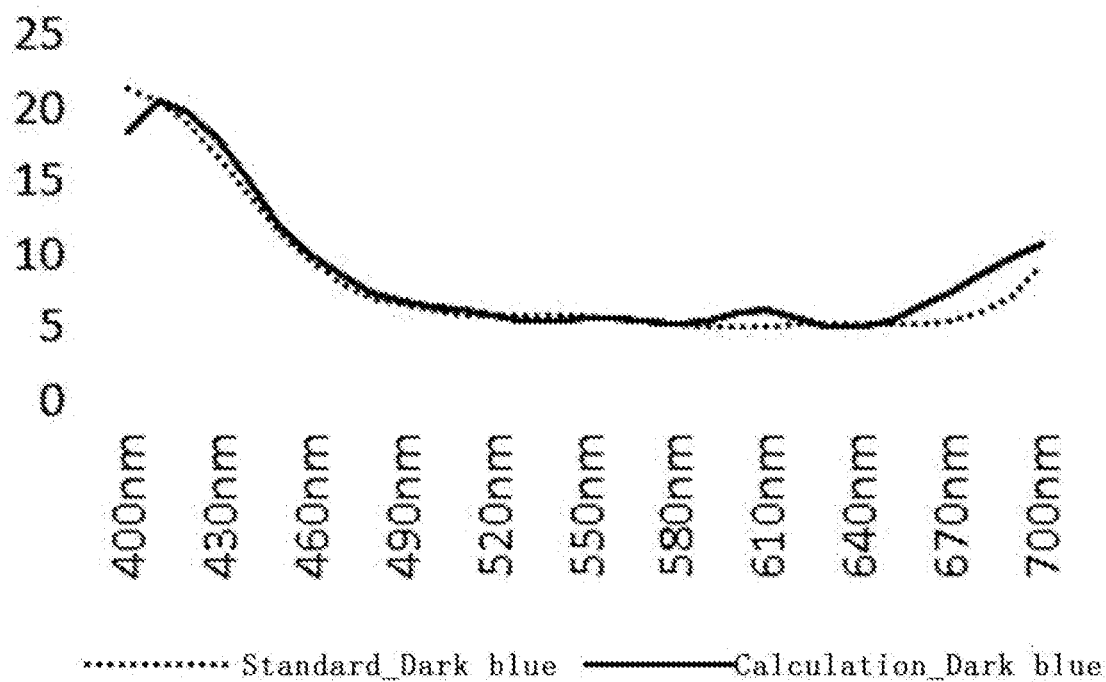
FIG. 14L shows a comparison between standard blue reflectivity and calculated blue reflectivity in the present invention.

Verification results of reflectivity:

The standard reflectivity data (400-700 nm), 8-channel data and calculated reflectivity data (400-700 nm) of BCRA12 color bricks are as shown in FIGS. 13A, 13B and 13C, and comparisons between the standard reflectivity data and the calculated reflectivity data are as shown in FIGS. 14A to 14L.

Upon verification, this solution can output the spectral reflectivity, calculate the Yxy valves at D65/10° by using the spectral reflectivity, and compare the standard Yxy data. The indication errors can satisfy Grade II conformity requirements of the *Verification Regulation of Colorimeters and Color Difference Meters* (JJG595). The data of BCRA12 color bricks are as follows:

| Color | Standard Data | | | Verification Data | | | Difference | | |
|---|---|---|---|---|---|---|---|---|---|
| | Y | x | y | Y | x | y | ΔY | Δx | Δy |
| Standard_White | 64.22 | 0.3143 | 0.3321 | 64.27 | 0.3155 | 0.3325 | 0.05 | 0.0012 | 0.0004 |
| Standard_Gray | 29.07 | 0.3143 | 0.3312 | 28.48 | 0.3149 | 0.3311 | −0.59 | 0.0006 | −0.0001 |
| Standard_Gray | 27.63 | 0.3113 | 0.3376 | 27.22 | 0.3125 | 0.3383 | −0.41 | 0.0012 | 0.0007 |
| Standard_Black | 8.77 | 0.3150 | 0.3349 | 8.61 | 0.3122 | 0.3331 | −0.16 | −0.0028 | −0.0018 |
| Standard_Purplish red | 14.81 | 0.3725 | 0.3099 | 14.26 | 0.3720 | 0.3066 | −0.55 | −0.0005 | −0.0033 |
| Standard_Red | 14.39 | 0.4614 | 0.3340 | 13.61 | 0.4550 | 0.3284 | −0.78 | −0.0064 | −0.0056 |
| Standard_Orange | 34.73 | 0.5008 | 0.3827 | 33.01 | 0.4986 | 0.3815 | −1.72 | −0.0022 | −0.0012 |
| Standard_Yellow | 61.25 | 0.4501 | 0.4646 | 59.03 | 0.4466 | 0.4652 | −2.22 | −0.0035 | 0.0006 |
| Calculation_Green | 23.55 | 0.2928 | 0.4060 | 23.60 | 0.3009 | 0.4102 | 0.05 | 0.0081 | 0.0042 |
| Calculation_Green | 24.00 | 0.3010 | 0.4128 | 24.03 | 0.3082 | 0.4166 | 0.03 | 0.0072 | 0.0038 |
| Standard_Blue | 24.58 | 0.2192 | 0.2692 | 24.42 | 0.2236 | 0.2714 | −0.16 | 0.0044 | 0.0022 |
| Standard_Dark blue | 5.84 | 0.2552 | 0.2347 | 6.01 | 0.2576 | 0.2310 | 0.17 | 0.0024 | −0.0037 |

Indication error requirements of the *Verification Regulation of Colorimeters and Color Difference Meters* (JJG595):

| | | Grade I | Grade II |
|---|---|---|---|
| Stability | Δh (Y) | ≤0.2 | ≤0.4 |
| Repeatability | s (Y) | ≤0.3 | ≤0.5 |
| | s (x), s (y) | ≤0.001 | ≤0.003 |
| | s (ΔE) | ≤0.2 | ≤0.4 |
| Reproducibility | Δl (Y) | ≤1.0 | ≤2.0 |
| | Δl (x), Δl (y) | ≤0.002 | ≤0.006 |
| | Δl (ΔE) | ≤0.5 | ≤0.7 |
| Indication Error | ΔY | ≤1.5 | ≤3 |
| | Δx, Δy | ≤0.020 | ≤0.025 |

Color difference is compared with CIE1976 color difference formula for BCRA12 color bricks, and the data are as follows:

| Color | Standard Data | | | Verification Data | | | Color Difference | | | |
|---|---|---|---|---|---|---|---|---|---|---|
| | L* | a | b* | L* | a | b* | ΔL* | Δa* | Δb* | ΔE*ab |
| Standard_White | 84.08 | −0.29 | 0.45 | 84.10 | 0.10 | 0.78 | 0.02 | 0.39 | 0.33 | 0.51 |
| Standard_Gray | 60.84 | 0.13 | 0.11 | 60.32 | 0.35 | 0.15 | −0.52 | 0.22 | 0.04 | 0.57 |
| Standard_Gray | 59.55 | −3.01 | 1.35 | 59.18 | −2.78 | 1.67 | −0.37 | 0.23 | 0.32 | 0.54 |
| Standard_Black | 35.53 | −0.60 | 0.77 | 35.22 | −0.84 | 0.22 | −0.31 | −0.24 | −0.55 | 0.68 |
| Standard_Purplish red | 45.37 | 21.76 | 1.60 | 44.61 | 22.39 | 0.81 | −0.76 | 0.63 | −0.79 | 1.26 |
| Standard_Red | 44.79 | 35.02 | 17.86 | 43.67 | 34.66 | 15.40 | −1.12 | −0.36 | −2.46 | 2.73 |
| Standard_Orange | 65.54 | 39.85 | 48.23 | 64.17 | 39.02 | 46.42 | −1.37 | −0.83 | −1.81 | 2.42 |
| Standard_Yellow | 82.51 | 3.07 | 75.55 | 81.31 | 1.74 | 73.65 | −1.20 | −1.33 | −1.90 | 2.61 |
| Calculation_Green | 55.63 | −26.91 | 14.28 | 55.68 | −25.31 | 16.19 | 0.05 | 1.60 | 1.91 | 2.49 |
| Calculation_Green | 56.08 | −26.03 | 16.84 | 56.12 | −24.66 | 18.58 | 0.04 | 1.37 | 1.74 | 2.21 |
| Standard_Blue | 56.66 | −15.52 | −26.29 | 56.51 | −14.27 | −25.17 | −0.15 | 1.25 | 1.12 | 1.69 |
| Standard_Dark blue | 28.99 | 9.07 | −20.58 | 29.44 | 10.88 | −21.39 | 0.45 | 1.81 | −0.81 | 2.03 |

The above-mentioned embodiments are only used for describing, rather than limiting, the technical solutions of the present invention. Although the present invention is described in detail by reference to the above-mentioned embodiments, those of ordinary skill in the art should understand that, they can still make modifications to the technical solutions recorded in the above-mentioned embodiments, or make equivalent substitutions to a part of or all technical characteristics thereof, but these modifications or substitutions will not make the corresponding technical solutions deviate from the scope of the technical solutions in the embodiments of the present invention.

What is claimed is:

1. A colorimeter based on a multichannel spectrum, comprising: a main unit and a calibration box, wherein
the main unit comprises; an integrating sphere, a light source and a main sensor, a detection hole is formed in one side of a top of the integrating sphere, a light-through hole is formed in a side of the integrating sphere, and a measuring port is formed in a bottom of the integrating sphere, the main sensor is arranged outside the detection hole, and the light source is arranged outside the light-through hole;
the calibration box comprises a housing and a white board arranged at a top of the housing, the white board is correspondingly matched with the measuring port, and the calibration box is connected with the main unit;
the main sensor is a multichannel spectral sensor;
the main unit is composed of an upper cover, a light guide ring, a PCB board and a main body successively from top to bottom, wherein a first internal thread arranged inside the upper cover is connected with an external thread arranged outside the light guide ring, threaded fixing holes with a second internal thread formed in the light guide ring are connected with the main body through a connecting screw, and an indicating light source is arranged on the PCB board.

2. The colorimeter based on the multichannel spectrum according to claim 1, wherein a light barrier is arranged at a lower end of the light-through hole.

3. The colorimeter based on the multichannel spectrum according to claim 1, wherein a diaphragm piece is arranged in the detection hole.

4. The colorimeter based on the multichannel spectrum according to claim 1, wherein a light output hole is formed in one side of the light source, and an auxiliary sensor is arranged at the other side of the light output hole.

5. The colorimeter based on the multichannel spectrum according to claim 1, wherein a stepped notch is formed in the top of the housing, the white board is arranged at a bottom of the stepped notch, corresponding magnetic devices are arranged around the white board and at a top and a bottom of the main unit respectively, and the calibration box is jacketed with the main unit through the stepped notch and magnetically fixed through the magnetic devices.

6. The colorimeter based on the multichannel spectrum according to claim 5, wherein the magnetic device arranged at the bottom of the main unit is an opened hoop, the magnetic devices arranged around the white board are magnets, and a magnetic induction sensor is arranged at an opening of the opened hoop.

7. The colorimeter based on the multichannel spectrum according to claim 6, wherein an automatic magnetic induction calibration process is used for a microprogrammed control unit (MCU), the process comprising the following steps:
S101, the MCU waits placement of the magnetic induction sensor into an opening;
S102, the MCU senses the placement, and S103 proceeds when a difference between a last calibration time and a current time is larger than an interval threshold, or the process returns to S101;
S103, S104 proceeds when magnets are continuously detected within a continuous threshold, or the process returns to S101;
S104, multiple calibration measurements are performed, and S105 proceeds when the magnets are not moved in the calibration process, or the process returns to S101;
S105, S106 proceeds when a signal fluctuation between the calibration measurements is less than a fluctuation threshold, or the process returns to S101; and
S106, an average value of the multiple calibration measurements is compared with a last calibrated signal; the calibration succeeds when the signal fluctuation is less than the fluctuation threshold, and the average value of the multiple calibration measurements and a last calibration measurement time of this round are saved, and the process returns to S101, or the process returns to S101 directly.

8. The colorimeter based on the multichannel spectrum according to claim 7, wherein the white board, an elastic device and a button are arranged on the housing from top to bottom, legs arranged at a top of the button are correspondingly matched with calibration box holes formed in the top of the housing and a measurement button arranged at the top of the main unit, and a protrusion arranged at an edge of a bottom of the button is matched with a button pressing plate arranged at a bottom of the housing.

9. The colorimeter based on the multichannel spectrum according to claim 6, wherein the white board, an elastic device and a button are arranged on the housing from top to bottom, legs arranged at a top of the button are correspondingly matched with calibration box holes formed in the top of the housing and a measurement button arranged at the top of the main unit, and a protrusion arranged at an edge of a bottom of the button is matched with a button pressing plate arranged at a bottom of the housing.

10. The colorimeter based on the multichannel spectrum according to claim 5, wherein the white board, an elastic device and a button are arranged on the housing from top to bottom, legs arranged at a top of the button are correspondingly matched with calibration box holes formed in the top of the housing and a measurement button arranged at the top of the main unit, and a protrusion arranged at an edge of a bottom of the button is matched with a button pressing plate arranged at a bottom of the housing.

* * * * *